(12) United States Patent
Nguyen et al.

(10) Patent No.: US 12,188,123 B2
(45) Date of Patent: Jan. 7, 2025

(54) DEPOSITION OF IODINE-CONTAINING CARBON FILMS

(71) Applicant: American Air Liquide, Inc., Fremont, CA (US)

(72) Inventors: Phong Nguyen, Newark, DE (US); Fabrizio Marchegiani, Newark, DE (US); Nathan Stafford, Damascus, OR (US); Xiangyu Guo, Bear, DE (US)

(73) Assignee: American Air Liquide, Inc., Fremont, CA (US)

( * ) Notice: Subject to any disclaimer, the term of this patent is extended or adjusted under 35 U.S.C. 154(b) by 1 day.

(21) Appl. No.: 17/555,140

(22) Filed: Dec. 17, 2021

(65) Prior Publication Data

US 2023/0193460 A1 Jun. 22, 2023

(51) Int. Cl.
*C23C 16/455* (2006.01)
*C23C 16/505* (2006.01)
*C23C 16/56* (2006.01)

(52) U.S. Cl.
CPC .. *C23C 16/45534* (2013.01); *C23C 16/45536* (2013.01); *C23C 16/45553* (2013.01); *C23C 16/505* (2013.01); *C23C 16/56* (2013.01)

(58) Field of Classification Search
USPC ....... 427/488, 491, 522, 523, 524, 525, 526, 427/534, 536
See application file for complete search history.

(56) References Cited

U.S. PATENT DOCUMENTS

| | | | |
|---|---|---|---|
| 4,588,609 A * | 5/1986 | Leyden | B05D 1/60 522/66 |
| 5,277,750 A | 1/1994 | Frank | |
| 5,417,770 A * | 5/1995 | Saitoh | G03G 5/08278 136/258 |
| 5,445,712 A | 8/1995 | Yanagida | |
| 6,410,102 B1 * | 6/2002 | Hashizume | C23C 16/4405 427/535 |
| 6,508,948 B2 | 1/2003 | Felker et al. | |
| 7,041,596 B1 | 5/2006 | Dalton et al. | |
| 9,659,788 B2 | 5/2017 | Surla et al. | |
| 10,074,534 B2 | 9/2018 | Behera et al. | |
| 10,331,033 B2 | 6/2019 | Shin et al. | |
| 10,410,878 B2 | 9/2019 | Sun et al. | |
| 10,607,850 B2 | 3/2020 | Surla et al. | |
| 11,314,168 B2 | 4/2022 | Tan et al. | |
| 2006/0140839 A1 | 6/2006 | Oka | |
| 2008/0283973 A1 * | 11/2008 | Oberbeck | C23C 16/45529 257/632 |
| 2011/0059617 A1 * | 3/2011 | Mitchell | H01J 37/32357 438/723 |
| 2011/0180941 A1 | 7/2011 | Hwang et al. | |
| 2014/0084219 A1 | 3/2014 | Zhao et al. | |
| 2015/0371869 A1 * | 12/2015 | Surla | H01L 21/31116 558/461 |
| 2017/0178923 A1 * | 6/2017 | Surla | H01L 21/31116 |
| 2017/0278709 A1 | 9/2017 | Mebarki et al. | |
| 2017/0342548 A1 | 11/2017 | Shimizu et al. | |
| 2019/0027368 A1 | 1/2019 | Matsuura | |
| 2019/0390340 A1 | 12/2019 | Yu et al. | |
| 2020/0006160 A1 | 1/2020 | Lin et al. | |
| 2020/0203174 A1 | 6/2020 | Surla et al. | |
| 2021/0285102 A1 | 9/2021 | Yoon et al. | |
| 2023/0352483 A1 | 11/2023 | Yang et al. | |
| 2023/0360922 A1 * | 11/2023 | Weimer | H01L 21/0332 |

FOREIGN PATENT DOCUMENTS

| | | |
|---|---|---|
| JP | 3 291 885 | 6/2002 |
| TW | 2017 34267 | 10/2017 |
| TW | 2018 25446 | 7/2018 |
| TW | 2020 15182 | 4/2020 |
| TW | I703631 | 9/2020 |
| TW | 2021 38905 | 10/2021 |
| TW | 2021 41645 | 11/2021 |
| WO | WO 2009 019210 | 2/2009 |
| WO | WO 2019 002058 | 1/2019 |
| WO | WO-2021146138 A1 * | 7/2021 ........... C23C 16/047 |

OTHER PUBLICATIONS

Au, Y. et al., Filling narrow trenches by iodine-catalyzed CVD of copper and manganese on manganese nitride barrier-adhesion layers, Journal of The Electrochemical Society, 158 (5), 2011, D248-D253.

Falaise, C. et al., Capture of iodine in highly stable metal-organic frameworks: a systematic study, Chem. Commun. 2013, 49, 10320-10322.

Grzeskowiak, S. et al., Cross sections of EUV PAGs: influence of concentration, electron energy, and structure, downloaded from http://proceedings.spiedgitallibrary.org/ on Jun. 14, 2016.

Huheey, J.E. et al., Inorganic chemistry: principles of structure and reactivity, 4$^{th}$ ed., 1993, HarperCollins College Publishers, A25-A33.

Karecki, S.M. et al., Plasma etching of dielectric films with novel iodofluorocarbon chemistries: iodotrifluoroethylene and 1-iodoheptafluoropropane, Journal of Vacuum Science & Technology A 16, 755, 1998, 755-758.

(Continued)

*Primary Examiner* — Jose I Hernandez-Kenney
(74) *Attorney, Agent, or Firm* — Yan Jiang

(57) ABSTRACT

A method for depositing an iodine-containing film on a substrate material comprises: exposing the substrate material to a vapor of a film-forming composition comprising an iodine-containing precursor having a formula of $C_aH_xI_yF_z$, wherein a=1-10, x≥0, y≥1, z≥0, x+y+z=a, 2a or 2a+2; provided that when a=1, x=2 and z=0, y is not equal to 2, and depositing the iodine-containing film formed by the iodine-containing precursor on the substrate material through a vapor deposition method. The method further comprises exposing the substrate material to a vapor of a co-reactant nitrogen-containing molecule having a general formula $C_xH_yF_zNH$, where x=1-6, y=0-13, z=0-13, and a=1-2 or $C_xH_yF_zN—R^1$, where x=1-6, y=0-13, z=0-13, and $R^1$ is a $C_1$-$C_5$ hydrocarbon.

8 Claims, 14 Drawing Sheets

(56) References Cited

OTHER PUBLICATIONS

Li, L. et al., Extreme ultraviolet resist materials for sub-7 nm patterning, Chem. Soc, Rev. 2017, 46, 4855-4866.
Yu, M. et al., Positive tone oxide nanoparticle EUV (ONE) photoresists, downloaded from http://proceedings.spiedgitallibrary.org/ on Mar. 29, 2016.
International Search Report and Written Opinion for corresponding PCT/US2022/052709, Mar. 28, 2023.
International Search Report and Written Opinion for related PCT/US2022/052706, Mar. 7, 2023.

* cited by examiner

DEPOSITION OF IODINE-CONTAINING CARBON FILMS

TECHNICAL FIELD

The present invention is related to methods of depositing an iodine-containing film on a substrate material, in particular, to the methods of using iodine-containing precursors, having a formula of $C_aH_xI_yF_z$, wherein a=1-10, x≥0, y≥1, z≥0, x+y+z=a, 2a or 2a+2, and a nitrogen-containing co-reactant, having a general formula $C_xH_yF_zNH_a$ wherein x=1-6, y=0-13, z=0-13, and a=1-2 or $C_xH_yF_zN$—$R^1$, wherein x=1-6, y=0-13, z=0-13, and $R^1$ is a $C_1$-$C_5$ hydrocarbon, to deposit the iodine-containing film on the substrate material through a thermal or plasma method, wherein the deposition step modifies the substrate material or dopes iodine into the substrate material.

BACKGROUND

Extreme ultraviolet (EUV) lithography (13.5 nm) is becoming a primary method of choice for <32 nm half-pitch device fabrication. Critical challenges for novel EUV resist design includes EUV quantum yield, photospeed, etc., which limits the usage of current Iodinated carbon layer/chemical amplified resist (CAR) for <7 nm half pitch node (Li, et al., Chem. Soc. Rev., 2017, 2, 4855-4866). The photon density in 13.5 nm photolithography is much lower than the density used in conventional 193 nm ArF patterning with the same dosage. The thinner films also lead to tremendous decrease in total optical absorption. One major obstacle for further development of polymer based CARs for EUV patterning is their low photon absorption due to the poor EUV absorbance cross-section from carbon and oxygen, and high photon shot noise from the high photon energy. There is a need to develop novel nonchemically amplified resists material/layer to improve such EUV absorption for achieving sub-5 nm patterning and beyond.

Resist sensitivity, or photospeed, is strongly dependent on the photoacid generator, which is modified with high EUV photon efficient elements such as Indium (In), Tin (Sn), Antimony (Sb), Tellurium (Te), Iodine (I), Xenon (Xe), Caesium (Cs) possess high photon absorption at 91.6 eV (13.5 nm). Among these element, iodine element has been shown as a promising candidate to improve EUV sensitivity (Grzeskowiak, et al., G. Proc. SPIE 9779, Advances in Patterning Materials and Processes XXXIII, 97790C (21 Mar. 2016)). Iodine element could be doped into carbon matrix to enhance EUV absorption of layer during patterning process such as resist less lithography. Such formed iodine-containing polymer and/or amorphous carbon may be utilized to enhance critical dimension of semiconductor feature.

US 2017/0178923 discloses a method for etching silicon-containing films as well as the deposition of iodine-containing polymers as sidewall passivation layers using iodine-containing etching compounds have the formula $C_aH_xF_yI_z$, wherein a=1-3, x=0-6, y=1-7, z=1-2, x+y+z=4 when a=1, x+y+z=4 or 6 when a=2, and x+y+z=6 or 8 when a=3, US20170278709 discloses deposition of a conformal organic material over a feature formed in a photoresist or a hardmask, to decrease the critical dimensions and line edge roughness. In various embodiments, an ultra-conformal carbon-based material is deposited over features formed in a high-resolution photoresist. The carbon layer is synthesized via hydrocarbon gases including halogenated hydrocarbons such as carbon tetrachloride (CCl4), diiodomethane (CH2I2), chlorofluorocarbon (CFC), bromotrichloromethane (BrCCl3), 1,1-dichloroethylene, bromobenzene, or derivatives thereof. The hydrocarbon compounds may be partially or completely doped derivatives of hydrocarbon compounds, including fluorine-containing, oxygen-containing, hydroxyl group-containing, and boron-containing derivatives of hydrocarbon compounds. The carbon layer can be doped with nitrogen element via $C_xH_yN_z$ molecule via PECVD method.

US10074534 discloses deposition of a conformal carbon-based material. The deposition temperature may be about 80° C. to about 550° C. The carbon layer can be formed via hydrocarbon precursor including halogenated hydrocarbons such as carbon tetrachloride ($CCl_4$), diiodomethane ($CH_2I_2$), chlorofluorocarbon (CFC), bromotrichloromethane ($BrCCl_3$), 1,1-dichloroethylene, bromobenzene, or derivatives thereof may also be used. The carbon layer can be doped with nitrogen element via $C_xH_yN_z$ molecule via PECVD method.

Au et.al ("Filling Narrow Trenches by Iodine-Catalyzed CVD of Copper and Manganese on Manganese Nitride Barrier/Adhesion Layers", J Electrochem Soc, 158 (5) D248-D253 (2011)) disclose a process for the void-free filling of sub-100 nm trenches with copper or copper-manganese alloy by CVD. Conformally deposited manganese nitride serves as an underlayer that initially chemisorbs iodine. CVD of copper or copper-manganese alloy releases the adsorbed iodine atoms from the surface of the manganese nitride, allowing iodine to act as a surfactant catalyst floating on the surface of the growing copper layer. The iodine source disclosed is ethyl iodide $CH_3CH_2I$.

US20190390340 disclosed methods of depositing a metal film with high purity utilizing a thermal ALD process comprising an alkyl halide and a metal precursor, selectively depositing a metal film with high purity on a metal surface over a dielectric surface, selectively deposit a metal film with high purity on a dielectric surface over a metal surface, and depositing a metal film with greater than 99% metal atoms on an atomic basis. The alkyl halide source has the general formula R—X, where R is an alkyl, alkenyl, aryl, or other carbonaceous group. In some embodiments, R comprises one to two, one to four, or one to six carbon atoms. In some embodiments, the alkyl halide comprises or consists essentially of iodoethane ($H_5C_2I$) or diiodomethane ($CH_2I_2$).

US20210285102 discloses methods of depositing a metal film formed on the bottom of feature having a metal bottom and dielectric sidewalls using a metal precursor and an alkyl halide catalyst while the substrate is maintained at a deposition temperature. The metal precursor has a decomposition temperature above the deposition temperature. The alkyl halide comprises carbon and halogen, and the halogen comprises bromine or iodine.

U.S. Pat. No. 7,041,596 discloses an excited surfactant species created by generating plasma discharge in a surfactant precursor gas. The surfactant species includes at least one of iodine, led, thin, gallium, and indium. A surface of an integrated circuit substrate is exposed to the excited surfactant species to form a plasma-treated surface, A ruthenium thin film is deposited on the plasma-treated surface using a CVD technique.

U.S. Pat. No. 5,277,750 discloses a method for anisotropic dry etching of metallization layers containing aluminum or aluminum alloys, using an etching layer. Aluminum etching processes based on iodine chemistry, that is, economical use of molecular iodine (I2) as an etching gas in a practical manner because iodine is a solid at room temperature. Moreover, etching chemistry based on iodine such as IF$_7$ seems not promising. Accordingly, the use of hydrogen iodide as an etching gas has been proposed in recent years only for the sake of reactive ion etching of silicon layers and tin layers on semiconductor substrates.

U.S. Pat. No. 10,331,033 discloses a film composition including a first material that includes one of an aromatic ring-containing monomer and a polymer containing a repeating unit that includes an aromatic ring-containing monomer, a second material that includes at least one of a hexagonal boron nitride and a precursor thereof, a chalcogenide-based material and a precursor thereof, and a two-dimensional carbon nanostructure and a precursor thereof, the two-dimensional carbon nanostructure containing about 0.01 atom percent to about 40 atom percent of oxygen, and a solvent.

US2014084219 discloses carbon nanotube fibers that include one or more fiber threads. The fiber threads include doped multi-walled carbon nanotubes, such as doped double-walled carbon nanotubes. The carbon nanotubes are functionalized with one or more functional groups. The carbon nanotube fibers are doped with various dopants, such as iodine and antimony pentafluoride.

US 2011/0059617 discloses methods of etching high-aspect-ratio features in dielectric materials such as silicon oxide. The methods may include a concurrent introduction of a fluorocarbon precursor and an iodo-fluorocarbon precursor into a substrate processing system housing a substrate. The fluorocarbon precursor may have an F:C atomic ratio of about 2:1 or less, and the iodo-fluorocarbon may have an F:C ratio of about 1.75:1 to about 1.5:1. Exemplary precursors may include CF, CF$_3$ and CFI, among others. The substrate may have regions of exposed silicon oxide and an overlying patterned Iodinated carbon layer that exposes narrow regions of silicon oxide. The plasma generates one or more etching species and one or more polymer deposition precursors. The polymer deposition precursors may react to form the fluorinated carbon layer on the sidewalls of the trench. The inclusion of CFI in the process plasma contributes to the polymer since it is thought to produce CF fragments but its inclusion also produces CF" and I" fragments which assist in the etch process.

U.S. Pat. No. 9,659,788B2 to Surla et al. discloses a method for etching silicon-containing films using an organofluorine compound as a precursor containing at least one C≡N or C═N functional group.

Falaise et al. ("Capture of iodine in highly stable metal—organic frameworks: a systematic study", Chem. Commun., 2013, 49, 10320) disclose use of two novel etch chemistries belonging to the iodofluorocarbon family, iodotrifluoroethylene and 1-iodoheptafluoropropane, in a dielectric etch application. Etching method (50 G magnetic field 93 mTorr pressure, 600 W RF power, and 25 sccm IFC of etch gas flow) shows atm 1%: 7.2% via C$_2$F$_5$I, 10.74% via C$_2$F$_3$I, 4.99% via 2-C$_3$F$_7$I, 4.42% via 1-C$_3$F$_7$I.

Karecki et al. ("Plasma etching of dielectric films with novel iodofluorocarbon chemistries: Iodotrifluoroethylene and 1-iodoheptafluoropropane", J Vac Sci & Tech A 16, 755 (1998)) disclose the use of two etch chemistries belonging to the iodofluorocarbon family, iodotrifluoroethylene and 1-iodoheptafluoropropane, in a dielectric etch application. Iodofluorocarbons such as those disclosed are presently believed not to possess long-term environmental impacts. Under the conditions tested, the two iodofluorocarbons disclosed have both been found to etch silicon dioxide films readily. 1-iodoheptafluoropropane has also been found to be capable of etching silicon nitride films under these conditions.

U.S. Pat. No. 6,508,948 to Scott et al. discloses a method for etching features into a substrate by removing substrate material from selected areas while leaving the substrate substantially unaffected in other areas using a chemical species of halogenated heterocyclic hydrocarbons.

U.S. Pat. No. 10,410,878 to Sun et al. discloses a method for using a hydrofluorocarbon etching compound selected from the group consisting of 2,2,2-Trifluoroethanamine (C$_2$H$_4$F$_3$N), 1,1,2-Trifluoroethan-1-amine (Iso-C$_2$H$_4$F$_3$N), 2,2,3,3,3-Pentafluoropropylamine (C$_3$H$_4$F$_5$N), 1,1,1,3,3-Pentafluoro-2-Propanamine (Iso-C$_3$H$_4$F$_5$N), 1,1,1,3,3-Pentafluoro-(2R)-2-Propanamine (Iso-2R—C$_3$H$_4$F$_5$N) and 1,1,1,3,3-Pentafluoro-(2S)-2-Propanamine (Iso-2S—C$_3$H$_4$F$_5$N), 1,1,1,3,3,3-Hexafluoroisopropylamine (C$_3$H$_3$F$_6$N) and 1,1,2,3,3,3-Hexafluoro-1-Propanamine (Iso-C$_3$H$_3$F$_6$N) to selectively plasma etching silicon containing films, such as a dielectric antireflective coat (DARC) layer (e.g., SiON), alternating SiO/SiN layers, alternating SiO/p-Si layers, versus a photoresist layer and/or a hard mask layer (e.g., amorphous carbon layer), wherein the photoresist layer is reinforced and SiO/SiN and/or SiO/p-Si are etched non-selectively.

Li et al, ("Extreme ultraviolet resist materials for sub-7 nm patterning", Chem. Soc. Rev., 2017, 2, 4855-4866) disclose continuous ongoing development of dense integrated circuits requires significant advancements in nanoscale patterning technology. Advancements in novel resist materials are reviewed to identify design criteria for establishment of a next generation resist platform. Development strategies and the challenges in next generation resist materials are summarized and discussed.

Yu et al, ("Positive tone oxide nanoparticle EUV (ONE) photoresists", Proc. SPIE 9779, Advances in patterning materials and processes XXXIII, 977905, 21 Mar. 2016) disclose nanoparticles with a variety of organic/inorganic combinations and the negative tone patterning using EUV radiation. Zirconium methacrylate (ZrMAA) nanoparticles had sensitivity with EUV exposure as high as 4.2 mJ/cm$^2$ with a resolution up to 22 nm, and an LER of 5.6 nm.

SUMMARY

There is disclosed a method for depositing an iodine-containing film on a substrate material, the method comprising:

a) exposing the substrate material to a vapor of a film-forming composition comprising an iodine-containing precursor having a formula of C$_a$H$_x$I$_y$F$_z$, wherein a=1-10, x≥0, y≥1, z≥0, x+y+z=a, 2a or 2a+2; provided that when a=1, x=2 and z=0, y is not equal to 2, and b) depositing the iodine-containing film formed by the iodine-containing precursor on the substrate material through a vapor deposition method. The disclosed methods may include one or more of the following aspects:

the step b) comprising modifying the substrate material and/or doping iodine into the substrate material;
the step b) comprising modifying the substrate material;
the step b) comprising doping iodine into the substrate material;
additionally, when a=0 and x=0, the iodine-containing precursors including I$_2$, IF$_3$, IF$_5$, and IF$_7$;
additionally, when a=0, z=0, the iodine-containing precursors including HI;
the iodine-containing precursor being CH$_3$I, iodomethane;
the iodine-containing precursor being C$_2$H$_2$F$_3$I, 2-iodo-1,1,1-trifluoroethane;

further comprising exposing the carbon-containing material to a vapor of a co-reactant sequentially or simultaneously with the step a);

further comprising exposing the substrate material to a vapor of a co-reactant sequentially with the step a), that is, after the step a) and before the step b);

further comprising exposing the substrate material to a vapor of a co-reactant simultaneously with the step a);

the co-reactant being a nitrogen-containing molecule having a general formula $C_xH_yF_zNH_a$ where $x=1-6$, $y=0-13$, $z=0-13$, and $a=1-2$ or $C_xH_yF_zN—R^1$, where $x=1-6$, $y=0-13$, $z=0-13$, and $R^1$ is a $c_1$-$C_5$ hydrocarbon;

the nitrogen-containing molecule containing $N≡C—R^1$, wherein $R^1$ has the formula $H_aF_bC_c$, where $a=1-11$, $b=1-11$, and $c=1-5$;

the nitrogen-containing molecule containing $(N≡C—)—(R^2)—(—C≡N)$, wherein $R^2$ has the formula $H_mF_nC_o$ with $m=0$, $n=1-11$, and $o=1-5$;

the nitrogen-containing molecule containing $R^3_x[—C=N(R^4_z)]_y$, wherein $x=1-2$, $y=1-2$, $z=0-1$, $x+z=1-3$, and $R^3$ and $R^4$ each independently has the formula $H_eF_fC_g$ with $e=0-11$, $f=0-11$, and $g=0-5$;

the nitrogen-containing molecule being 2,3,3,3-Tetrafluoropropanenitrile, $C_3HF_4N$;

the nitrogen-containing molecule being 3-Pentanamine, 1,1,1-trifluoro-4-methyl-, $C_6H_{12}F_3N$;

the nitrogen-containing molecule being 2-Butanae, 1,1,3,3,4,4,4-heptafluoro-, $C_4H_4F_7N$;

the nitrogen-containing molecule being 1-Butanamine, 1,1,2,2,3,3,4,4,4-nonafluoro-, $C_4H_2F_9N$;

the nitrogen-containing molecule being 1-Butanamine, 2,2,3,3,4,4,4-heptafluoro-, $C_4H_4F_7N$;

the nitrogen-containing molecule being 1,1,1,3,3,3-Hexafluoroisopropylamine, $C_3H_3F_6N$;

the nitrogen-containing molecule being 2,3,5,6-Tetrafluoropyridine, $C_5HF_4N$;

the nitrogen-containing molecule being 2,3,4,5,6-Pentafluoropyridine, $C_5F_5N$;

the nitrogen-containing molecule being 2,4,6-Trifluoro-1,3,5-triazine, $C_3F_3N_3$;

the nitrogen-containing molecule being 2,3,5,6-Tetrafluoropyrazine, $C_4N_2F_4$;

the nitrogen-containing molecule being 3,4,5,6-Tetrafluoropyridazine, $C_4N_2F_4$;

the nitrogen-containing molecule being 2,4,5,6-Tetrafluoropyrimidine, $C_4N_2F_4$;

the nitrogen-containing molecule being 2,4,6-Tris(trifluoromethyl)-1,3,5-triazine, $C_6F_9N_3$;

the nitrogen-containing molecule being 2,3,6-Trifluoropyridine, $C_5H_2F_3N$;

the nitrogen-containing molecule being 3,4,5-Trifluoropyridine, $C_5H_2F_3N$;

the nitrogen-containing molecule being 2,3,5-Trifluoropyridine, $C_5H_2F_3N$;

the nitrogen-containing molecule being 2,4,5-Trifluoropyridine, $C_5F_3H_2N$;

the nitrogen-containing molecule being 2,4-Difluoro-1,3,5-triazine, $C_3HF_2N_3$;

the nitrogen-containing molecule being 3,6-Difluoro-1,2,4-triazine, $C_3HF_2N_3$;

the nitrogen-containing molecule being 2-Fluoro-1,3,5-triazine, $C_3H_2FN_3$;

the nitrogen-containing molecule being 2,4-Difluoro-6-(1,1,2,2,2-pentafluoroethyl)-1,3,5-triazine, $C_5F_7N_3$;

the nitrogen-containing molecule being 2-Fluoro-4,6-bis(trifluoromethyl)-1,3,5-triazine, $C_5F_7N_3$;

the nitrogen-containing molecule being 2,4-Difluoro-6-(trifluoromethyl)-1,3,5-triazine, $C_4F_5N_3$;

the nitrogen-containing molecule being 2-Iodopyridine, $C_5H_4NI$;

the nitrogen-containing molecule being 3-Pyridyl iodide, $C_5H_4NI$;

the nitrogen-containing molecule being 4-Iodopyridine, $C_5H_4NI$;

the nitrogen-containing molecule being 1,3,4,5-Tetrafluoro-1H-pyrazole, $C_3F_4N_2$;

the nitrogen-containing molecule being 1,2,4,5-Tetrafluoro-1H-imidazole, $C_3F_4N_2$;

the nitrogen-containing molecule being 1,2,3,4,5-Pentafluoro-1H-pyrrole, $C_4NF_5$;

the nitrogen-containing molecule being 3-Fluoropyridine, $C_5H_4FN$;

the nitrogen-containing molecule being Pyridine, $C_5H_5N$;

the co-reactant being a nitrogen-containing molecule selected from $N_2$, $NH_3$, hydrazine $N_2H_4$, dimethylhydrazine $C_2H_8N_2$, guanidine $CH_5N_3$, primary and secondary amine e.g. ethylene diamine or imino e.g. diiminopyridine etc.;

the nitrogen-containing molecule being $N_2$;

the nitrogen-containing molecule being $NH_3$;

the nitrogen-containing molecule being hydrazine $N_2H_4$;

the nitrogen-containing molecule being dimethylhydrazine $C_2H_8N_2$;

the nitrogen-containing molecule being guanidine $CH_5N_3$;

the nitrogen-containing molecule being primary and secondary amine e.g. ethylene diamine;

the nitrogen-containing molecule being ethylene diamine;

the nitrogen-containing molecule being imino e.g. diiminopyridine etc.;

the nitrogen-containing molecule being diiminopyridine etc.;

the co-reactant being an oxidizer;

the oxidizer being selected from $O_2$, $O_3$, CO, $CO_2$, NO, $N_2O$, $NO_2$, $H_2O$, $H_2O_2$, COS, $SO_2$, compressed air or combinations thereof;

the oxidizer being $O_2$;

the oxidizer being $O_3$;

the co-reactant being an inert gas;

the inert gas being selected from He, Ar, $N_2$, Xe, Kr, Ne, or combinations thereof;

the inert gas being Ar;

the co-reactant being an additive gas;

the additive gas being selected from $CF_4$, $CH_3F$, $C_2F_3$, $C_3F_3$, $C_2HF_5$, $C_5F_8$, $C_6F_6$, $C_4F_6$, or $C_4F_8$;

the additive gas being $C_1$ to $C_{10}$ saturated or unsaturated linear, branched, cyclic hydrofluorocarbons;

the additive gas being $C_4H_2F_6$, $C_3H_2F_6$, $CHF_3$, $CH_2F_2$, or combinations thereof;

the additive gas being an iodine-containing additive, other than the iodine-containing precursor $C_aH_xI_yF_z$, having a formula $C_bH_mI_nF_o$, wherein $b=1-10$, $m≥0$, $n≥1$, $o≥0$, $m+n+o=2b+2$, $2b$ or $b$; provided that when $b=0$ and $m=0$, the iodine-containing additives include $I_2$, $IF_3$, $IF_5$, and $IF_7$; when $b=0$, $o=0$, the iodine-containing additives include HI;

the iodine-containing additive $C_bH_mI_nF_o$ is different from the iodine-containing precursor $C_aH_xI_yF_z$ when exposing the substrate material to the iodine-containing precursor and the iodine-containing additive gas;

the vapor deposition method being a thermal or plasma deposition process;

the vapor deposition method being a thermal deposition process;
the vapor deposition method being a plasma deposition process;
the vapor deposition method being plasma equipment;
the vapor deposition method being using an etcher;
the vapor deposition method being using a LAM tool etcher;
the vapor deposition method being a plasma enhanced ALD;
the vapor deposition method being a plasma enhanced CVD;
the vapor deposition method being a thermal ALD;
the vapor deposition method being a thermal CVD;
an iodine atomic concentration in the iodine-containing film ranging from approximately 0.01% to approximately 99.9% with a uniform concentration through the iodine-containing film;
an iodine atomic concentration in the iodine-containing film ranging from approximately 0.01% to approximately 50% with a uniform concentration through the iodine-containing film;
an iodine atomic concentration in the iodine-containing film ranging from approximately 7% to approximately 30% with a uniform concentration through the iodine-containing film;
an iodine atomic concentration in the substrate material ranges from approximately 0.01% to approximately 50%;
an iodine atomic concentration in the substrate material ranges from approximately 7% to approximately 30%;
a deposition pressure ranging from about $10^{-3}$ torr to 1000 torr;
a deposition pressure ranging from about 1 mTorr to 760 Torr;
a deposition temperature ranging from about $-110°$ C. to $1100°$ C.;
a plasma power ranging from about 25 W to about 100,000 W;
a plasma power ranging from about 100 W to 25000 W;
a gas flow of the iodine-containing gas ranging from approximately 0.01% to approximately 99.9%;
the substrate material being a underneath layer;
the substrate material being a silicon containing layer;
the substrate material being a carbon-containing layer; and
the substrate material being an amorphous carbon layer.

There is disclosed a method for depositing an iodine-containing and nitrogen-containing film on a substrate material, the method comprising:
a) sequentially or simultaneously exposing the substrate material to a vapor of a film-forming composition and a vapor of a nitrogen-containing molecule,
wherein the film-forming composition comprises an iodine-containing precursor having a formula of $C_aH_xI_yF_z$, wherein a=0-10, x≥0, y≥1, z≥0, x+y+z=a, 2a or 2a+2, provided that when a=1, x=2 and z=0, y is not equal to 2,
wherein the nitrogen-containing molecule has a general formula $C_mH_nF_oNH_b$ or $C_mH_nF_oN-R^1$ where m=1-6, n=0-13, o=0-13, b=1-2, and $R^1$ is a $C_1$-$C_5$ hydrocarbon; and
b) depositing the iodine-containing film formed by the iodine-containing precursor on the substrate material through a thermal or plasma method. The disclosed methods may include one or more of the following aspects:
the step b) comprising modifying the substrate material and/or doping iodine into the substrate material;
the step b) comprising modifying the substrate material;
the step b) comprising doping iodine into the substrate material;
the iodine-containing precursor being $OH_3I$, iodomethane;
the iodine-containing precursor being $C_2H_2F_3I$, 2-iodo-1,1,1-trifluoroethane
the nitrogen-containing molecule is $C_3HF_4N$,
an iodine atomic concentration in the iodine-containing film ranging from approximately 0.01% to approximately 99.9% with a uniform concentration through the iodine-containing film;
an iodine atomic concentration in the iodine-containing film ranging from approximately 0.01% to approximately 50% with a uniform concentration through the iodine-containing film;
an iodine atomic concentration in the iodine-containing film ranging from approximately 7% to approximately 30% with a uniform concentration through the iodine-containing film;
an iodine atomic concentration in the substrate material ranges from approximately 0.01% to approximately 50%; and
an iodine atomic concentration in the substrate material ranges from approximately 7% to approximately 30%.

There is disclosed a method for depositing an iodine-containing film on the substrate material, the method comprising:
a) sequentially or simultaneously exposing the substrate material to a vapor of $CH_3I$ or $C_2H_2F_3I$ and a vapor of $C_3HF_4N$; and
b) depositing a layer of iodine-containing polymer formed by $CH_3I$ or $C_2H_2F_3I$ on the substrate material through a thermal or plasma method,
wherein the step b) comprises modifying the substrate material and/or doping iodine into the substrate material. The disclosed methods may include one or more of the following aspects:
an iodine atomic concentration in the iodine-containing polymer ranging from approximately 0.01% to approximately 99.9% with a uniform concentration through the iodine-containing polymer;
an iodine atomic concentration in the iodine-containing polymer ranging from approximately 0,011% to approximately 50% with a uniform concentration through the layer of the iodine-containing polymer;
an iodine atomic concentration doped in the iodine-containing polymer ranging from approximately 7% to approximately 30% with a uniform concentration through the layer of the iodine-containing polymer;
an iodine atomic concentration in the substrate material ranges from approximately 0.01% to approximately 50%; and
an iodine atomic concentration in the substrate material ranges from approximately 7% to approximately 30%.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "wafer" or "patterned wafer" refers to a wafer having a stack of silicon-containing films on a substrate and a patterned film on the stack of silicon-containing films formed for pattern etch.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (including, but not limited to, crystalline, amorphous, porous, etc.), silicon containing layers (including, but not limited to, $SiO_2$, SiN, SiON, SiCOH, etc.), metal or metal containing layers (including, but not limited to, copper, cobalt, ruthenium, tungsten, platinum, palladium, nickel, ruthenium, gold, etc.) or combinations thereof. Furthermore, the substrate may be planar or patterned. The substrate may be an organic patterned Iodinated carbon layer film, The substrate may include layers of oxides which are used as dielectric materials in field effect transistor (FET) such as FinFET, MOFSET, GAAFET(Gate all-around FET), Ribbon-FET, Nanosheet, Forksheet FET, Complementary FET (CFET), MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes, One of ordinary skill in the art will recognize that the terms "film" or "layer" used herein refer to a thickness of some material laid on or spread over a surface and that the surface may be a trench or a line, Throughout the specification and claims, the wafer and any associated layers thereon are referred to as substrates, The substrate can be any solid that has functional groups on its surface that are prone to react with the reactive head of a SAM, and may include without limitation 3D objects or powders.

The term "wafer" or "patterned wafer" refers to a wafer having a stack of films on a substrate and at least the top-most film having topographic features that have been created in steps prior to the deposition of the indium containing film.

The term "processing" as used herein includes deposition of material or Iodinated carbon layer, patterning, exposure, development, etching, cleaning, and/or removal of the material or Iodinated carbon layer as required in forming a described structure.

The term of "deposit" or "deposition" refers to a series of processes where materials at atomic or molecular levels are deposited on a wafer surface or on a substrate from a gas state (vapor) to a solid state as a thin layer. Chemical reactions are involved in the process, which occur after creation of a plasma of the reacting gases or activation the reacting gases by heat. The plasma may be a capacitively coupled plasma (CCP), generally created by radio frequency (RF) (alternating current (AC)) frequency or direct current (DC) discharge between two electrodes, the space between which is filled with the reacting gases. The plasma may also be microwave plasma. In addition, the deposition process for EUV lithography is also run inside an etch chamber. Suitable commercially available plasma etching chambers include but are not limited to the Applied Materials magnetically enhanced reactive ion etcher sold under the trademark eMAX™ or the Lam Research Dual CCP reactive ion etcher Dielectric etch product family sold under the trademark 2300® Flex™.

The term "aspect ratio" refers to a ratio of the height of a trench (or aperture) to the width of the trench (or the diameter of the aperture).

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "aperture", "via", "hole" and "trench" may be used interchangeably to refer to an opening formed in a semiconductor structure.

The term "additive" used herein refers to a compound or gas that is added to other etching compounds and provides some improving characteristics of the etch such as improving the profile characteristics, such as bowing, CD, ellipticity, etc.

As used herein, the abbreviation "NAND" refers to a "Negative AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Note that herein, the terms "deposition temperature" and "substrate temperature" may be used interchangeably. It is understood that a substrate temperature may correspond to, or be related to a deposition temperature, and that the deposition temperature may refer to the substrate temperature.

Note that herein, the terms "precursor" and "deposition compound" and "deposition gas" may be used interchangeably when the precursor is in a gaseous state at room temperature and ambient pressure. It is understood that a precursor may correspond to, or be related to a deposition compound or deposition gas, and that the deposition compound or deposition gas may refer to the precursor.

Note that herein, the terms "dope" is used interchangeably to the process of incorporation of one or more elements into a film through various methods where that element may be chemically bond or physically bond. The element may be doped interstitial or substitutional within the film.

The standard abbreviations of the elements from the periodic table of elements are used herein, It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

As used herein, the term "hydrocarbon" refers to a saturated or unsaturated function group containing exclusively carbon and hydrogen atoms. As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to any propyl group (i.e.m n-propyl or isopropyl); the abbreviation "iPr" refers to an isopropyl group; the abbreviation "Bu" refers to any butyl group (n-butyl, iso-butyl, tent-butyl, sec-butyl); the abbreviation "tBu" refers to a tert-butyl group; the abbreviation "sBu" refers to a sec-butyl group; the abbreviation "iBu" refers to an iso-butyl group; the abbreviation "Ph" refers to a phenyl group; the abbreviation "Am" refers to any amyl group (iso-amyl, sec-amyl, tert-amyl); the abbreviation "Cy" refers to a cyclic hydrocarbon group (cyclobutyl, cyclopentyl, cyclohexyl, etc.); the abbreviation "Ar" refers to an aromatic hydrocarbon group (phenyl, xylyl, mesityl, etc.).

As used herein, the term "doping" refers to the process of intentionally incorporating atoms of different elements into the film composition.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used herein, the term "independently" when used in the context of describing R groups should be understood to denote that the subject R croup is not only independently selected relative to other R groups bearing the same or different subscripts or superscripts, but is also independently selected relative to any additional species of that same R group. For example in the formula $MR^1_x$ $(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances, In addition, the articles "a" and "an" as used in this application and the appended claims should generally be construed to mean "one or more" unless specified otherwise or clear from context to be directed to a singular form.

"Comprising" in a claim is an open transitional term which means the subsequently identified claim elements are a nonexclusive listing (i.e., anything else may be additionally included and remain within the scope of "comprising"). "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actors in the absence of express language in the claim to the contrary.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1A:
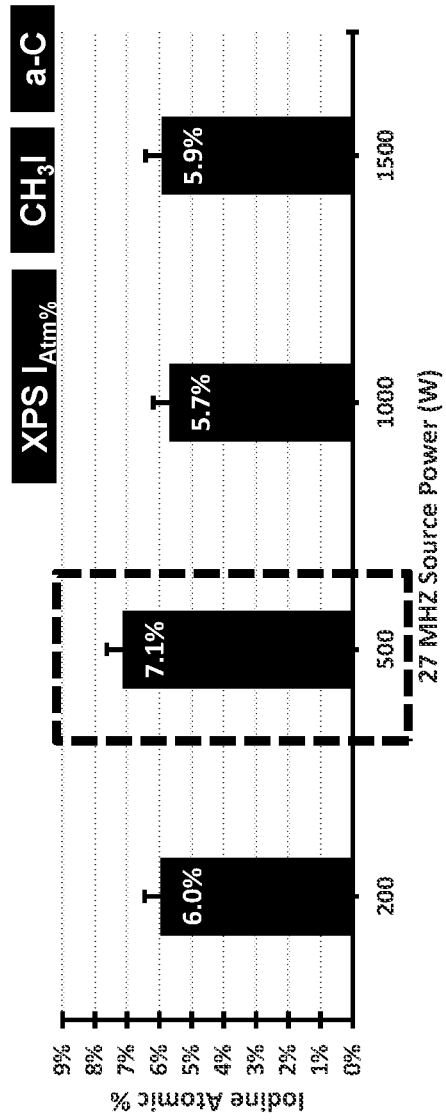
FIG. 1a shows atomic XPS concentration of iodine in a-C materials versus 27 MHz plasma source power (W) for deposition of $CH_3I$.

Disclosed are iodine-containing film forming compositions comprising iodine-containing precursors that may contain or may not contain halogens other than iodine, and methods of using the iodine-containing film forming compositions to deposit a thin film on a substrate material such as a carbon-containing material (e.g., amorphous carbon material), modify the surface of the substrate material and/or dope iodine into the substrate material through a vapor deposition method, such as a thermal or plasma deposition process, a plasma equipment such as an etcher (e.g., a LAM tool etcher), a plasma enhanced ALD or CVD and/or a thermal ALD or CVD. In some embodiments, a nitrogen-containing molecule may be used as a co-reactant to enhance the deposition of the iodine-containing film, the modification of the substrate material and the doping of the iodine into the substrate material.

The substrate material or the modified and/or doped substrate material having a deposited iodine-containing thin film thereon may be used as an iodinated carbon film for etching processes. The deposited iodine-containing thin film may be located above the substrate material layer to be etched. Exemplary substrate material may include carbon-containing materials. Exemplary carbon-containing materials may include amorphous carbon (a-C), or boron and metal doped a-C or silicon doped a-C, or the like.

The disclosed method provides not only a new/novel chemistry to deposit an iodine-containing film on a carbon material surface, but also a method to enhance iodine concentration in the carbon material. Such iodine-modified layer may be utilized in various applications in semiconductor fabricating device. The disclosed iodine-containing precursors and the disclosed film forming compositions may be used for forming high-speed, high sensitivity semiconductor films, e.g., in CMOS systems, DARM memory, 3D NAND channel or in photodetectors.

The disclosed iodine-containing precursors and the disclosed film forming compositions are suitable to deposit corresponding element-containing films and their deposition method to synthesize the corresponding element-containing film. The deposited films using the disclosed method may be deposited uniformly on flat wafers or on patterned wafers, or in a "gap-fill" or "bottom-up gap-fill" approach.

The disclosed method provides a novel chemistry to modify surface of carbon materials with iodine-containing molecules or to deposit a thin layer of iodine-containing polymer using a combination of iodine molecule with nitrogen-containing molecules, and iodine molecule with oxygen containing molecules.

The disclosed iodine-containing precursors have a formula of $C_aH_xI_yF_z$, wherein a=1-10, x≥0, y≥1, z≥0, x+y+z=a; 2a or 2a+2; provided that when a=1, x=2 and z=0, y is not equal to 2; provided that when a=0 and x=0, the iodine-containing precursors include $I_2$, $IF_3$, $IF_5$, and $IF_7$; provided that when a=0, z=0, the iodine-containing precursors include HI. Two examples of the disclosed iodine-containing precursors are $CH_3I$ and $C_2H_2F_3I$ shown in Table 1.

TABLE 1

| Molecule name | Molecule formula | Molecule structure | CAS No. | B.P. (° C.) |
|---|---|---|---|---|
| Iodomethane | $CH_3I$ |  | 74-88-4 | 42.5 |
| 2-Iodo-1,1,1-trifluoroethane | $C_2H_2F_3I$ | 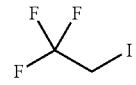 | 353-83-3 | 54 |

The disclosed film forming compositions may include the nitrogen-containing molecules, such as N-containing hydroflurocarbons (HFC) and/or fluorocarbons. The addition of nitrogen in the deposition process may increase the iodine composition of the deposited film and the iodine concentration doped into the underneath layer such as carbon-containing material as well as play a beneficial role in the EUV process. The nitrogen may be in a form of $N_2$, $NH_3$ or in a form of hydrocarbon, hydrofluorocarbon molecule where the nitrogen is bonded to carbon and the nitrogen functional group is —C≡N, C=N, or —C—N—R where R is carbon or hydrogen (—NH or —$NH_2$ group), or the nitrogen is within a ring structure bonded to carbon or another nitrogen molecule. Among any of these molecules, the iodine may be contained within the molecule as well. The elements containing in the thin film deposited with the disclosed method using a plasma source are not limited to C, I, N or C, I, O on a substrate where the substrate is carbon or silicon containing material. The thin film may be deposited using either a gas containing C, I, N or C, I, O, but not limited to, or using a combination of an iodine containing gas and nitrogen or oxygen containing gas.

The nitrogen-containing molecules used in the disclosed methods may have a general formula $C_xH_yF_zNH_a$ where x=1-6, y=0-13, z=0-13, and a=1-2 or $C_xH_yF_zN$—$R^1$ where $R^1$ may be $C_1$-$C_5$ hydrocarbon. The nitrogen-containing molecules used in the disclosed methods may contain N≡C—$R^1$, wherein $R^1$ has the formula $H_aF_bC_c$, where a=1-11, b=1-11, and c=1-5; (N≡C—)—($R^2$)—(—C≡N), wherein $R^2$ has the formula $H_mF_nC_o$ with m=0, n=1-11, and o=1-5; and $R^3_x$[—C=N($R^4_z$)]$_y$, wherein x=1-2, y=1-2, z=0-1, x+z=1-3, and $R^3$ and $R^4$ each independently has the formula $H_eF_fC_g$ with e=0-11, f=0-11, and g=0-5. Examples of the disclosed nitrogen-containing molecules listed in Table 2. The nitrogen-containing molecule used in the disclosed method may be 2,3,3,3-Tetrafluoropropanenitrile, $C_3HF_4N$.

TABLE 2

| Molecule name | Molecule formula | Molecule structure | CAS No. | B.P. (° C.) |
|---|---|---|---|---|
| 2,3,3,3-Tetrafluoropropanenitrile | $C_3HF_4N$ | 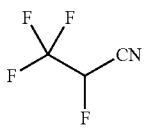 | 431-32-3 | 40.5 |

TABLE 2-continued

| Molecule name | Molecule formula | Molecule structure | CAS No. | B.P. (° C.) |
|---|---|---|---|---|
| 3-Pentanamine, 1,1,1-trifluoro-4-methyl- | $C_6H_{12}F_3N$ | | 1248444-86-1 | 106.9 |
| 2-Butanamine, 1,1,3,3,4,4,4-heptafluoro- | $C_4H_4F_7N$ | | 2228660-44-2 | 99.3 |
| 1-Butanamine, 1,1,2,2,3,3,4,4,4-nonafluoro- | $C_4H_2F_9N$ | | 74753-16-5 | 38.2 |
| 1-Butanamine, 2,2,3,3,4,4,4-heptafluoro- | $C_4H_4F_7N$ | | 374-99-2 | 68 |
| 1,1,1,3,3,3-Hexafluoroisopropylamine | $C_3H_3F_6N$ | | 1619-92-7 | 57 |
| 2,3,5,6-Tetrafluoropyridine | $C_5HF_4N$ | | 2875-18-5 | 102 |
| 2,3,4,5,6-Pentafluoropyridine | $C_5F_5N$ | | 700-16-3 | 83-85 |
| 2,4,6-Trifluoro-1,3,5-triazine | $C_3F_3N_3$ | | 675-14-9 | 73-74 |
| 2,3,5,6-Tetrafluoropyrazine | $C_4N_2F_4$ | | 13177-77-0 | 102.8 |

TABLE 2-continued

| Molecule name | Molecule formula | Molecule structure | CAS No. | B.P. (° C.) |
|---|---|---|---|---|
| 3,4,5,6-Tetrafluoropyridazine | $C_4N_2F_4$ | | 7627-80-7 | 199.3 |
| 2,4,5,6-Tetrafluoropyrimidine | $C_4N_2F_4$ | | 767-79-3 | 83 |
| 2,4,6-Tris(trifluoromethyl)-1,3,5-triazine | $C_6F_9N_3$ | | 368-66-1 | 98.3-98.5 at 748 mmHg |
| 2,3,6-Trifluoropyridine | $C_5H_2F_3N$ | | 3512-18-3 | 100-102 |
| 3,4,5-Trifluoropyridine | $C_5H_2F_3N$ | | 67815-54-7 | 85-87 |
| 2,3,5-Trifluoropyridine | $C_5H_2F_3N$ | | 76469-41-5 | 102 |
| 2,4,5-Trifluoropyridine | $C_5F_3H_2N$ | | 837365-04-5 | 99-101 |
| 2,4-Difluor-1,3,5-triazine | $C_3HF_2N_3$ | | 1207861-13-9 | 282.6 |
| 3,6-Difluoro-1,2,4-triazine | $C_3HF_2N_3$ | | 919785-60-7 | 282.6 ± 23.0 |

TABLE 2-continued

| Molecule name | Molecule formula | Molecule structure | CAS No. | B.P. (° C.) |
|---|---|---|---|---|
| 2-Fluoro-1,3,5-triazine | $C_3H_2FN_3$ | | 96100-45-7 | 249.6 |
| 2,4-Difluoro-6-(1,1,2,2,2-pentafluoroethyl)-1,3,5-triazine | $C_5F_7N_3$ | | 714-56-7 | 210 |
| 2-Fluoro-4,6-bis(trifluoromethyl)-1,3,5-triazine | $C_5F_7N_3$ | | 717-62-4 | 82.83 |
| 2,4-Difluoro-6-(trifluoromethyl)-1,3,5-triazine | $C_4F_5N_3$ | | 368-55-8 | 76-78 |
| 2-Iodopyridine | $C_5H_4NI$ | | 5029-67-4 | 93 at 13 Torr |
| 3-Pyridyl iodide | $C_5H_4NI$ | | 1120-90-7 | 40 at 2.03 Torr |
| 4-Iodopyridine | $C_5H_4NI$ | | 15854-87-2 | 215.4 |
| 1,3,4,5-Tetrafluoro-1H-pyrazole | $C_3F_4N_2$ | | 478693-82-2 | 139.9 |
| 1,2,4,5-Tetrafluoro-1H-imidazole | $C_3F_4N_2$ | | 478693-82-1 | 204.1 |

TABLE 2-continued

| Molecule name | Molecule formula | Molecule structure | CAS No. | B.P. (° C.) |
|---|---|---|---|---|
| 1,2,3,4,5-Pentafluoro-1H-pyrrole | $C_4NF_5$ | | 445235-48-3 | 109.4 |
| 3-Fluoropyridine | $C_5H_4FN$ | | 372-47-4 | 107.5 |
| Pyridine | $C_5H_5N$ | | 110-86-1 | 115.2 |

Additionally, the nitrogen-containing molecules used in the disclosed methods may be $N_2$, $NH_3$, hydrazine $N_2H_4$, dimethylhydrazine $C_2H_8N_2$, guanidine $CH_5N_3$, primary and secondary amine e.g, ethylene diamine and imino e.g. diiminopyridine etc.

The oxygen containing molecules used in the disclosed methods include $H_pOC-R^1$, where p could be p=0, or 1, wherein $R^1$ has the formula $H_aF_bC_cO_o$ and a=1-11, b=1-11, o=1-2, and c=1-5; $(R^2-)-(O)-(-R^3)$, wherein $R^2$ has the formula $H_eF_fC_gO_h$ and e=1-11, f=1-11, o=1-2 and g=1-5; $R^3$ has the formula $H_mF_nC_oO_p$ with m=0, n=1-11, p=1-2 and o=1-5; and $R^4_x[-C=O(R^5_z)]_y$, wherein x=1-2, y=1-2, z=0-1, x+z=1-3, and $R^4$ and $R^5$ each independently has the formula $H_uF_vC_wO_z$ with u=0-11, v=0-11, z=1-2 and w=0-5. Examples of the disclosed oxygen-containing molecules include $COF_2$, $C_2O_2F_2$, $(CF_3)_3COH$, and the like.

In general, it is required to form a predetermined material pattern on a semiconductor wafer or glass substrate in the manufacture of integrated circuit semiconductor devices, liquid crystal displays, plasma displays, etc. The formation of the predetermined material pattern involves coating an iodinated carbon layer on a material layer deposited on the semiconductor wafer or glass substrate, forming an iodinated carbon layer pattern through exposure, and etching the material layer into the predetermined material pattern using the iodinated carbon layer pattern as an etching layer.

Figure 8A:
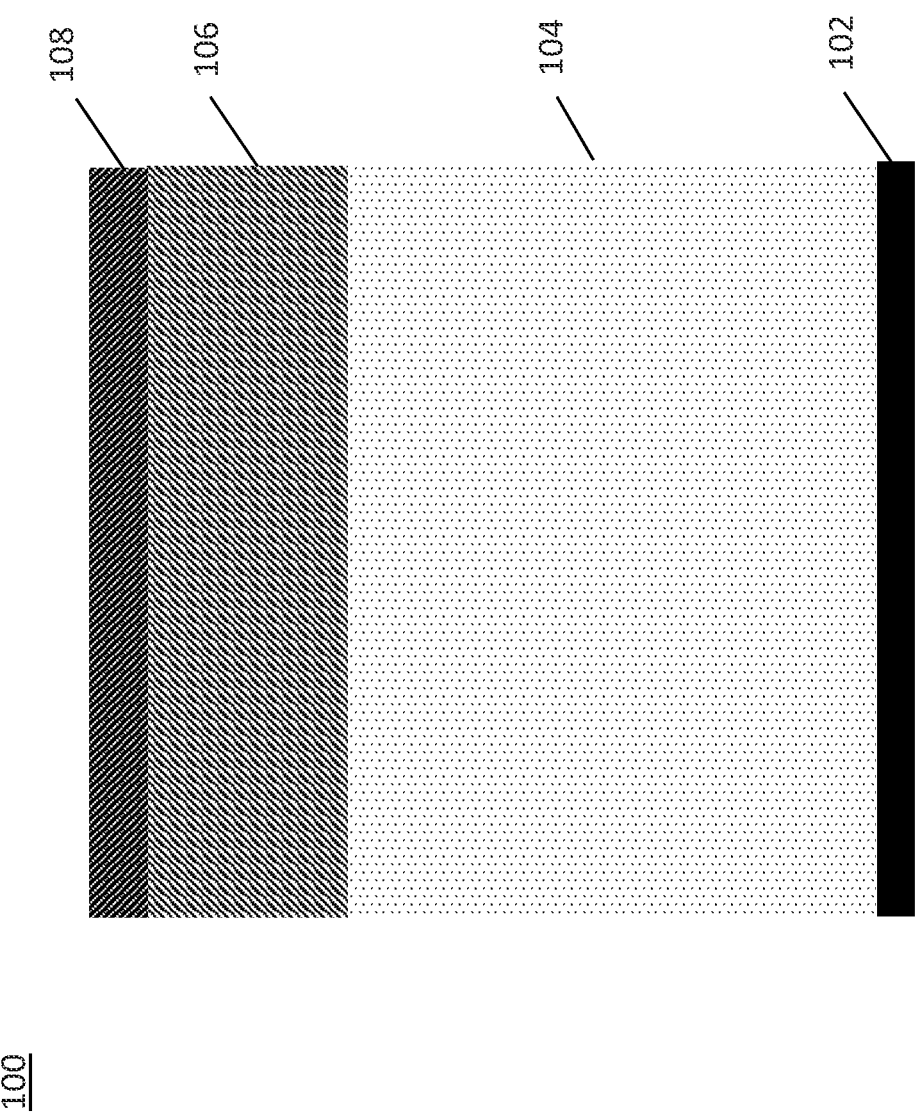
FIG. 8a shows is an exemplary cross-sectional side view of exemplary layers in a DRAM stack to produce a DRAM memory.
Figure 8B:
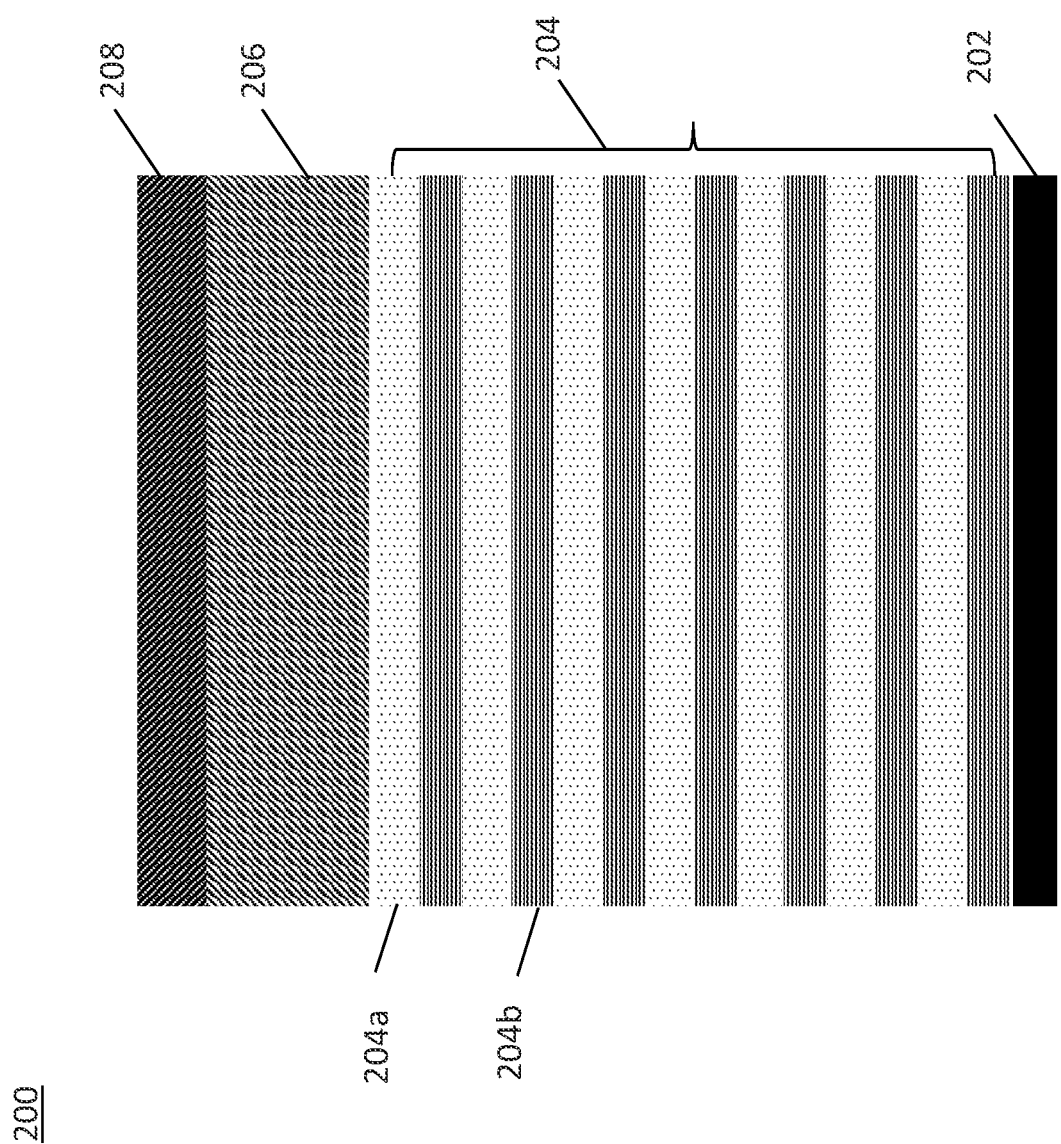
FIG. 8b shows an exemplary cross-sectional side view of exemplary layers in a 3D NAND stack to produce a 3D NAND gate.

In some embodiments, a substrate 100 may include a stack of multiple layers thereon as shown in FIG. 8a, which is an exemplary cross-sectional side view of exemplary layers in a DRAM stack to produce a DRAM memory. As shown, a stack of four layers is located on top of silicon wafer substrate 102. Hardmask layer 106 is located on top of SiO layer 104. SiO layer 104 could be replaced by alternative SiO/SiN layers or alternative SiO/poly Si layers (see FIG. 8b). Note that layer 104 could present or not present in the actual experiments. Hardmask layer 106 may be called as a substrate material, which may be a layer of CVD, PECVD, ALD, PEALD or spin on deposited (SOD) amorphous carbon or doped amorphous carbon, CVD, PECVD, ALD, PEALD or spin on deposited (SOD) amorphous carbon or doped amorphous Silicon, Silicon-containing spin on mask, or carbon-containing spin on mask. Hardmask layer 106 may contain C and H, as well as other elements, such as silicon, boron, nitrogen, sulfur, chlorine, fluorine or metals (Al, Zr, Ti, W, Y) etc. Alternatively, hardmask layer 106 is a doped a-C layer, for example, a boron-doped a-C layer, a tungsten-doped a-C layer, etc. In addition, hardmask layer 106 may also include SiCOH, SiC, SiCN, SiCON etc. Iodinated carbon layer 108 is deposited on top of hardmask layer 106. One of ordinary skill in the art will recognize that the stack of layers in FIG. 8a is provided for exemplary purposes only and that the disclosed iodine-containing film-forming compositions may be used to deposit iodinated carbon layer 108 on top of hardmask layer 106 and to modify hardmask layer 106 and/or dope iodine into hardmask layer 106. Furthermore, hardmask layer 106 may be deposited on any possible layers of 104 applied to semiconductor manufacture processes, for example, on a stack of multiple layers shown in FIG. 8b, which is an exemplary cross-sectional side view of exemplary layers in a 3D NAND stack to produce a 3D NAND gate. As shown, a stack of seven alternating SiO/SiN (i.e., 204a/204b) layers 204 is deposited on top of silicon wafer 202 (i.e., ONON or TCAT technology). One of ordinary skill in the art will recognize that some technologies replace SiN layers 204b with p-Si layers (e.g., SiO/p-Si or P-BICS technology). Hardmask layer 206 is deposited on the top of the seven SiO/SiN layers 204. Hardmask layer 206 may be an amorphous carbon (a-C) hardmask layer with or without dopants. Hardmask layer 206 may be a layer of CVD, PECVD, ALD, PEALD or spin on deposited (SOD) amorphous carbon or doped amorphous carbon, silicon-containing spin on mask, or carbon-containing spin on mask. Hardmask layer 206 may contain C and H, as well as other elements, such as boron, nitrogen, sulfur, chlorine, fluorine or metals (Al, Zr, Ti, W, Y) etc., to improve etch resistance during SiO/SiN layer etch. In this case, hardmask layer 206 is an a-C layer or a doped a-C layer, for example, a boron-doped a-C layer, a tungsten-doped a-C layer, etc. Iodinated carbon layer 208 is deposited on top of hardmask layer 206. One of ordinary skill in the art will recognize that the stack of layers in FIG. 8b is provided for exemplary purposes only and that the disclosed iodine-containing film-forming compositions may be used to form iodinated carbon layer 208 on top of hardmask layer 206 to deposit iodinated carbon layer 208 on top of hardmask layer 206 and to modify hardmask layer 206 and/or dope iodine into hardmask layer 206.

As discussed above, in order to enhance EUV absorption of the deposited film or layer using the disclosed method during patterning process such as resist less lithography, iodine element could be bind/doped to an a-C film or a carbon material or a carbon matrix. Such formed iodine-containing polymer and/or amorphous carbon may be utilized to enhance critical dimension of semiconductor features.

During a plasma process, the disclosed iodine-containing gases or precursors may be generated into the following forms: 1) iodine ion ($I^+$, $I^-$); 2) iodine radical ($I\cdot$); 3) iodine-containing polymeric ion ($^+C_xH_yI_zF_d$, $^-C_xH_yI_zF_d$; and 4) iodine-containing polymeric radicals ($\cdot C_xH_yI_zF_d$). The first and third form of iodine may be deposited onto the carbon surface through a control of bias power. In addition, these chemical forms will deposit as a polymer layer that could enhance EUV absorption of layer during a patterning process. Furthermore, these chemical forms could have iodine penetrate into the carbon-containing material to modify the carbon-containing material or modify the surface of the carbon-containing material and dope iodine into the carbon-containing material as well.

Also the disclosed are methods for forming the iodine-containing polymer on a carbon-containing material using a plasma deposition process. Applicants believe that the disclosed film forming compositions are suitable for a thermal or plasma deposition process, such as, thermal ALD and PEALED, thermally CVD and PECVD, plasma equipment such as a LAM tool etcher. The disclosed methods may be useful in the manufacture of semiconductor, photovoltaic, LCD-TFT, flat panel type devices.

With the disclosed method, an iodine atomic concentration in the iodine-containing polymer or film deposited on the carbon-containing material or the surface of the carbon-containing material may range from approximately 0.01% to approximately 99.9%, preferably, from approximately 0.01% to approximately 50%, more preferably, from approximately 7% to approximately 30%. Furthermore, the iodine atomic concentration in the iodine-containing polymer deposited on the carbon-containing material with the disclosed method maintains a uniform concentration through the iodine-containing polymer or film. With the disclosed method, an iodine atomic concentration doped in the carbon-containing material may range from approximately 0.01% to approximately 99.9%, preferably, from approximately 0.01% to approximately 50%, more preferably, from approximately 7% to approximately 30%.

The plasma method includes providing a plasma reaction chamber having a substrate disposed therein. The plasma reaction chamber may be any enclosure or chamber within a device in which etching methods take place such as, and without limitation, LAM tool etcher, Reactive Ion Etching (RIE), Dual Capacitively Coupled Plasma (CCP) with single or multiple frequency RF sources, Inductively Coupled Plasma (ICP), or Microwave Plasma reactors, cryogenic-RIE, or other types of etching systems capable of selectively removing a portion of the Si containing layer or generating active species. The etch chamber may also have a temperature controlled stage where the temperature may be controlled from −110° C. to 1100° C. One of ordinary skill in the art will recognize that the different plasma reaction chamber designs provide different electron temperature control.

The disclosed iodine-containing film forming compositions are provided at greater than 95% v/v purity, preferably at greater than 99.99% v/v purity, and more preferably at greater than 99.999% v/v purity. The disclosed Iodine-containing film forming compositions contain less than 5% v/v, preferably less than 1% v/v, more preferably less than 0.1% v/v, and even more preferably less than 0.01% v/v of any of its analogs or other reaction products. This embodiment may provide better process repeatability. This embodiment may be produced by purification (e.g., distillation, sublimation, chromatography, etc.) of the Iodine-containing film forming composition. The disclosed iodine-containing compounds contain less than 5% by volume trace gas impurities, with less than 150 ppm by volume of impurity gases, such as $H_2O$ and/or $CO_2$, contained in said trace gaseous impurities. Preferably, the water content in the plasma etching gas is less than 20 ppm by weight. The purified product may be produced by distillation and/or passing the gas or liquid through a suitable adsorbent, such as a 4 Å molecular sieve.

The disclosed iodine-containing film forming compositions contain less than 10% v/v, preferably less than 1% v/v, more preferably less than 0.1% v/v, and even more preferably less than 0.01% v/v of any of its isomers, which may be purified by distillation of the gas or liquid to remove isomers and may provide better process repeatability.

Alternatively, the disclosed iodine-containing film forming compositions may contain between 0.01% v/v and 99.99% v/v of its isomers, particularly when the isomer mixture provides improved process parameters or if isolation of the target isomer is too difficult or expensive. The mixture of isomers may also reduce the need for two or more gas lines to the reaction chamber.

Some of the disclosed iodine-containing film forming compositions are gaseous at room temperature and atmospheric pressure. For the non-gaseous (i.e., liquid or solid) compounds, their gas form may be produced by vaporizing the compounds through a conventional vaporization step, such as direct vaporization or by bubbling with inert gas (such as Ar, He, Kr, Xe, Ne), The non-gaseous compounds may be fed in liquid state to a vaporizer where it is vaporized before it is introduced into a reaction chamber.

The disclosed iodine-containing film forming compositions may be supplied either in neat form or in a blend with a suitable solvent, such as hydrocarbon such as ethyl benzene, xylene, mesitylene, decalin, decane, dodecane, alcohol such as methanol, ethanol etc. The disclosed precursors may be present in varying concentrations in the solvent.

The neat or blended iodine-containing film forming compositions are introduced into a reactor in a vapor form by conventional means, such as tubing and/or flow meters. The vapor form may be produced by vaporizing the neat or blended composition through a conventional vaporization step such as direct vaporization, distillation, by bubbling, or by using a sublimator. The neat or blended composition may be fed in liquid state to a vaporizer where it is vaporized before it is introduced into the reactor. Alternatively, the neat or blended composition may be vaporized by passing a carrier gas into a container containing the composition by bubbling the carrier gas into the composition. The carrier gas may include, but is not limited to, Ar, He, Ne, Kr, Xe and mixtures thereof. Bubbling with a carrier gas may also remove any dissolved oxygen present in the neat or blended composition. The carrier gas and composition are then introduced into the reactor as a vapor.

If necessary, the container containing the disclosed film forming composition may be heated to a temperature that permits the composition to have a sufficient vapor pressure. The container may be maintained at temperatures in the range of, for example, approximately 0° C. to approximately 250° C. Those skilled in the art recognize that the temperature of the container may be adjusted in a known manner to control the amount of precursor vaporized.

The reactor contains one or more substrates (including but not limited to, carbon layers, Si or Si-containing layers) onto which the iodine-containing films will be deposited. A substrate is generally defined as the material on which a process is conducted. The substrates may be any suitable substrate used in semiconductor, photovoltaic, flat panel, LCD-TFT device manufacturing. Examples of suitable substrates include wafers, such as silicon, silica, glass, GaAs wafers. The wafer may have one or more layers of differing materials deposited on it from a previous manufacturing step, as shown in FIG. 8a and FIG. 8b. For example, the wafers may include an a-C (amorphous, doped, porous, spin on) layer and a dielectric layer. Furthermore, the wafers may include an a-C layer on top of silicon layers (crystalline, amorphous, doped, porous, etc.), germanium-layer, Si—Ge, silicon oxide layers, silicon nitride layers, silicon oxy nitride layers, carbon doped silicon oxide (SiCOH) layers, metal, metal oxide, high-k materials (such as $Al_2O_3$, $HfO_2$, $ZrO_2$, etc.) metal nitride layers (Ti, Ru, Ta, etc.), alternating SiO and SiN layers, and combinations thereof. Additionally, the wafers may include an a-C layer on top of copper layers noble metal layers (e.g., platinum, palladium, rhodium, gold). The wafers may include an a-C layer on top of barrier layers, such as manganese, manganese oxide, Tin, TaN etc. Plastic layers, such as poly(3,4-ethylenedioxythiophene) poly(styrenesulfonate)[PEDOT:PSS] may also be used underneath an a-C hard layer. The layers may be planar or patterned. The disclosed processes may deposit the iodine-containing layer directly on the wafer or directly on one or more layers on top of the wafer when patterned layers are formed on the substrate. Furthermore, one of ordinary skill in the art will recognize that the terms "film" and "layer" used herein refer to a thickness of some material laid on or spread over a surface and that the surface may be a trench, a hole, a line, a via. Throughout the specification and claims, the wafer and any associated layers thereon are referred to as substrates. For example, for modification of a carbon-containing material, an iodine-containing film may be deposited onto a carbon-containing material a-C layer.

The substrate final application is not limited to the present invention, but this technology may find particular benefits for the following types of substrates: silicon wafers, glass wafers and panels, beads, powders and nano-powders, monolithic porous media, printed circuit board, plastic sheets, etc. Exemplary powder substrates include a powder used in rechargeable battery technology. A non-limiting number of powder materials include NMC (Lithium Nickel Manganese Cobalt Oxide), LCO (Lithium Cobalt Oxide), LFP (Lithium Iron Phosphate), and other battery cathode materials.

The temperature and the pressure within the reaction chamber are held at conditions suitable for vapor depositions, such as ALD and CVD. In other words, after introduction of the vaporized disclosed film forming composition into the reaction chamber, conditions within the reaction chamber are such that at least part of the precursor is deposited onto the substrate to form a layer. For instance, the pressure in the reactor or the deposition pressure may be held between about $10^{-3}$ torr and about 1000 torr preferably between about 1 mTorr and 760 torr, as required per the deposition parameters. Likewise, the temperature in the reactor or the deposition temperature may be held between about −110° C. and about 1100° C., preferably between about −110° C. and about 500° C. One of ordinary skill in the art will recognize that "at least part of the precursor is deposited" means that some all of the precursor reacts with adheres to the substrate.

The temperature to achieve optimal film growth may be controlled by either controlling the temperature of the substrate holder. Devices used to heat or cool the substrate are known in the art. The substrate is heated or cooled to a sufficient temperature to obtain the desired film at a sufficient deposition rate and with desired physical state and composition. A non-limiting exemplary temperature range to which the substrate may be changed includes from approximately −110° C. to approximately 1100° C.

Alternatively, the substrate may be heated to a sufficient temperature to obtain the desired Iodine-containing film at a sufficient deposition rate and with desired physical state and composition. A non-limiting exemplary temperature range to which the substrate may be heated or cooled includes being heated from room temperature to approximately 1100° C. and being cooled from room temperature to approximately to −110° C.

Depending on the particular process parameters, deposition may take place for a varying length of time. Generally, deposition may be allowed to continue as long as desired necessary to produce a film with the necessary properties. Typical film thicknesses may vary from several angstroms to several hundreds of microns, preferably from 0.1 nm to thousands of nm, more preferably, from monolayer (~0.1 nm) to 1 nm, that is from 0.1 to 1 nm, depending on the specific deposition process. The deposition process may also be performed as many times as necessary to obtain the desired thickness of the film.

The disclosed methods for depositing an iodine-containing layer on a carbon-containing material substrate include: placing the substrate in a reactor, delivering into the reactor a vapor of the disclosed Iodine-containing film forming composition, and contacting/adsorbing the vapor with the surface of the substrate (and typically directing the vapor to the substrate) to form an Iodine-containing layer on the surface of the substrate through a vapor deposition method, wherein the step of contacting/adsorbing modifies the carbon-containing material and/or doping iodine into the carbon-containing material. Alternatively, the disclosed methods for depositing an iodine-containing layer on a carbon-containing material substrate include: placing the substrate in a reactor, sequentially or simultaneously delivering into the reactor a vapor of the disclosed Iodine-containing film forming composition and a vapor of a nitrogen-containing molecule, and contacting/adsorbing the vapors with a surface of the substrate (and typically directing the vapor to the substrate) to form an Iodine-containing layer on the surface of the substrate through a vapor deposition method, wherein the step of contacting/adsorbing modifies the carbon-containing material substrate and/or doping iodine into the carbon-containing material. Alternatively, the disclosed methods for depositing an iodine-containing layer on a carbon-containing material substrate include: exposing the substrate to a vapor of the disclosed Iodine-containing film forming composition, and depositing/contacting/adsorbing an Iodine-containing layer on the surface of the substrate through a vapor deposition method, wherein the step of contacting/adsorbing modifies the carbon-containing material substrate and/or doping iodine into the carbon-containing material. Alternatively, the disclosed methods for depositing an iodine-containing layer on a carbon-containing material substrate: sequentially or simultaneously exposing the substrate to a vapor of the disclosed Iodine-containing film forming composition and a vapor of a nitrogen-containing molecule, and depositing/contacting/adsorbing an Iodine-containing layer on the surface of the substrate through a vapor deposition method, wherein the step of contacting/adsorbing modifies the carbon-containing material substrate and/or doping iodine into the carbon-containing material, The vapor of the iodine-containing film forming composition is generated and then introduced into a reaction chamber containing a substrate. The temperature and the pressure in the reaction chamber and the temperature of the substrate are held at conditions suitable for vapor deposition of at least part of the disclosed Iodine-containing precursor onto the substrate. In other words, after introduction of the vaporized composition into the reaction chamber, conditions within the reaction chamber are adjusted such that at least part of the precursor is deposited onto the substrate to form the Iodine-containing layer, One of ordinary skill in the art will recognize that "at least part of the precursor is deposited" means that some or all of the precursor reacts with or adheres to the substrate.

Herein, a co-reactant may also be used to help in the formation of the Iodine-containing layer and the doping of iodine.

The co-reactant may be the nitrogen-containing molecule stated above and listed in Table 2.

The co-reactant may be an oxidizer such as $O_2$, $O_3$, CO, $CO_2$, NO, $N_2O$, $NO_2$, $H_2O$, $H_2O_2$, COS, $SO_2$ and combinations thereof. The disclosed film forming composition and the oxidizer may be mixed together prior to introduction into the reaction chamber. Alternatively, the oxidizer may be introduced continuously into the chamber and the film forming composition may be introduced into the chamber in pulses, vice versa. The oxidizer may comprise between approximately 0.01% v/v to approximately 99.99% v/v of the mixture introduced into the chamber (with 99.99% v/v representing introduction of almost pure oxidizer for the continuous introduction alternative).

The co-reactant may be an additive gas or an additive chemical. The additive gas may be a fluorocarbon and/or hydrofluorocarbon. Exemplary disclosed fluorocarbons and/or hydrofluorocarbons used for the additives include $CF_4$, $CH_3F$, $C_2F_6$, $C_3F_6$, $C_2HF_5$, $C_5F_8$, $C_6F_6$, $C_4F_6$, $C_4F_3$, $C_1$ to $C_{10}$ saturated or unsaturated linear, branched, cyclic hydrofluorocarbons, such as $C_4H_2F_5$, $CHF_3$, $CH_2F_2$, or combinations thereof. The additive gas may also be an iodine-containing molecules same as the iodine-containing precursor having a formula $C_aH_xI_yF_z$ where a=0-10, x≥0, y≥1, z≥0, x+y+z=a, 2a or 2a+2, but the iodine-containing additive gas delivered to the reaction chamber is different from the iodine-containing precursor delivered to the reaction chamber. That is, an iodine-containing molecule, having a formula $C_aH_xI_yF_z$ where a=0-10, x≥0, y≥1, z≥0, x+y+z=a, 2a or 2a+2, will not be used simultaneously as a precursor and an additive gas. The iodine-containing additive gas may be $CH_3I$, $C_2H_5I$, $CF_3I$, $C_2F_5I$, $C_2H_2F_3I$, saturated or unsaturated linear, branched, cyclic such as $C_6H_5I$, $C_6H_4I_2$, $C_3F_5I$, $C_2F_3I$ etc. or combination thereof, When $CH_3I$ is used as the iodine-containing precursor, the iodine-containing additive gas will not be $CH_3I$. Similarly, when $C_2H_2F_3I$ is used as the iodine-containing precursor, the iodine-containing additive gas will not be $C_2H_2F_3I$. That is, the iodine-containing precursor and the iodine-containing additive gas are not the same molecules when they used in a deposition process.

The co-reactant may be the oxygen-containing molecules stated above.

The disclosed Iodine-containing film forming composition and the co-reactant may be introduced into the reactor either simultaneously (CVD), sequentially (ALD) or different combinations thereof. The reactor may be purged with an inert gas (e.g., Ar, He, Kr, Xe, Ne) between the introduction of the film forming composition and the introduction of the co-reactant. Alternatively, the co-reactant and the film forming composition may be mixed together to form a co-reactant/compound mixture, and then introduced to the reactor in a mixture form. Another example is to introduce the co-reactant continuously and to introduce the disclosed film forming composition by pulse (pulsed CVD). Another example is to introduce the co-reactant continuously and to introduce the film forming composition by pulse, while activating the co-reactant sequentially with a plasma, provided that the film forming composition and the non-activated co-reactant do not substantially react at the chamber temperature and pressure conditions (CW PEALD).

An inert gas is also introduced into the reaction chamber as a co-reactant in order to sustain the plasma. The inert gas may be He, Ar, Xe, Kr, Ne, or combinations thereof. The film forming composition and the inert gas may be mixed prior to introduction to the chamber, with the inert gas comprising between approximately 0.01% v/v and approximately 99.9% v/v of the resulting mixture. Alternatively, the inert gas may be introduced to the chamber continuously while the film forming composition is introduced to the chamber in pulses.

The disclosed film forming composition and co-reactant may be delivered into the reaction chamber in pulse. Each pulse of the disclosed film forming composition, if applied, may last for a time period ranging from about 0.001 seconds to about 30 minutes, alternatively from about 1 seconds to about 120 seconds, alternatively from about 5 seconds to about 60 seconds. The co-reactant may also be pulsed into the reactor, In such embodiments, the pulse of each may last for a time period ranging from about 0.01 seconds to about 30 minutes, alternatively from about 1 seconds to about 120 seconds, alternatively from about 2 seconds to about 60 seconds. In another alternative, the vaporized film forming compositions and co-reactants may be simultaneously sprayed from different sectors of a shower head (without mixing of the composition and the reactant) under which a susceptor holding several wafers is spun (spatial ALD).

The disclosed iodine-containing film forming composition and co-reactants may be mixed with other gases either prior to introduction into the reaction chamber or inside the reaction chamber. Preferably, the gases may be mixed prior to introduction to the chamber in order to provide a uniform concentration of the entering gas.

In another alternative, the vapor of the disclosed Iodine-containing film forming composition and co-reactants may be introduced into the chamber independently of the other gases, such as when two or more of the gases react or are easier to deliver independently.

In another alternative, the vapor of the disclosed Iodine-containing film forming composition and co-reactants are the only gases that are used during the deposition process.

In another alternative, the disclosed Iodine-containing film forming composition and the nitrogen-containing molecule are the only two gases that are used during the deposition process.

In another alternative, the disclosed Iodine-containing film forming composition, the nitrogen-containing molecule and the inert gas are the only three gases that are used during the deposition process.

In another alternative, the disclosed Iodine-containing film forming composition, the nitrogen-containing molecule and the oxidizer are the only three gases that are used during the deposition process.

In another alternative, the disclosed Iodine-containing film forming composition, the nitrogen-containing molecule, the additive gas and the oxidizer are the only gases that are used during the deposition process.

In another alternative, the disclosed Iodine-containing film forming composition, the nitrogen-containing molecule, the additive gas and the inert gas are the only gases that are used during the deposition process.

The vapor of the disclosed film forming composition is activated by plasma to produce an activated film forming composition. The plasma decomposes the film forming composition into radical form (i.e., the activated film forming composition). The same plasma treating process may be applied to the co-reactant including the inert gas, the nitrogen-containing molecule, the oxidizer and the additive gas. The plasma may be generated by applying RF or DC power. The plasma may be generated with a RF power ranging from about 25 W to about 100000 W, preferably, from about 100 W to about 25,000 W. The plasma may be generated remotely or within the reactor itself. The plasma may be generated in dual CCP or ICP mode with RF applied at both electrodes. RF frequency of plasma may range from 100 KHz to 1 GHz. Different RF sources at different frequency may be coupled and applied at same electrode. Plasma RF pulsing may be further used to control molecule fragmentation and reaction at substrate. One of skill in the art will recognize methods and apparatus suitable for such plasma treatment.

A quadrupole mass spectrometer (QMS), optical emission spectrometer (OES), FTIR, XPS, or other radical/ion measurement tools may measure the activated film forming composition from the chamber exhaust to determine the types and numbers of species produced. If necessary, the flow rate of the film forming composition and/or the inert gas may be adjusted to increase or decrease the number of radical species produced.

Upon obtaining a desired film thickness, the film may be subject to further processing, such as thermal annealing, furnace-annealing, rapid thermal annealing, photonic curing, UV curing, UV e-beam curing, laser curing, microwave curing, capping layers and/or plasma gas exposure.

After annealing, the films deposited by any of the disclosed processes may have a bulk resistivity at room temperature of approximately 1 µohm·cm to approximately 1 Mohm·cm. Room temperature is approximately 20° C. to approximately 25° C. depending on the season. Bulk resistivity is also known as volume resistivity. One of ordinary skill in the art will recognize that the bulk resistivity is measured at room temperature on the films that are typically approximately 50 nm thick. The bulk resistivity typically increases for thinner films due to changes in the electron transport mechanism. The bulk resistivity also increases at higher temperatures.

EXAMPLES

The following non-limiting examples are provided to further illustrate embodiments of the invention. However, the examples are not intended to be all inclusive and are not intended to limit the scope of the inventions described herein.

Experiments were carried out with commercial LAM tool 4520XLe 200 mm plasma etch tool (CCP dual frequency plasma with 10 gas lines).

Planar wafers tested are:
350 nm PE-CVD amorphous carbon (a-C) on Si substrate (purchased from Advantive Tech).
300 nm spin-on carbon (SOC) on Si substrate (purchased from SKW).

For planar test, the atomic polymer composition was evaluated through Kratos Axis Supra X-ray photoelectron spectroscopy (XPS) at different conditions tuning through LAM tool such as partial pressure of testing molecules, chuck/bottom temperature, 27 MHz source power and 2 MHz bias power. Two gases used during process are testing molecule and Ar.

In order to calculate the atomic concentration of elements inside the film, the following XPS method is employed: Monochromatic Al Kα (1486.6 eV), 10 mA of emission current, band pass every of 160, step size of 0.5 eV. In addition, XPS high resolution spectra was also used to determine the presence of different bonding, such spectra was collected via following method: Monochromatic Al Kα (1486.6 eV), 10 mA of emission current, band pass every of 20, step size of 0.1 eV.

Two commercially available molecules, $CH_3I$ and $C_2H_2F_3I$ were tested using the Lam 200 mm etch chamber under a variety of plasma process conditions by varying plasma power, temperature, flow rates, and pressure. In addition, we tested $2-C_3F_7I$ (CAS#677-69-0) as baseline process.

Baseline reference data: $2-C_3F_7I$ was evaluated as baseline etch compound to quantify the iodine concentration into the a-C layer. In order to simulate the polymer layer formation occurring on the top surface and on the sidewall during plasma processing etch of patterns the process condition were tuned: a-C layer coupons were etched at 30 mTorr for 60 sec, source power 750 W (27 MHz), and bias power 0 W (2 MHz) at the substrate. The process feed the mixture contains 250 sccm of Ar, 15 sccm of $2-C_3F_7I$ and no $O_2$. The neutrals and the active species reaching the surface stick to the surface, based on their sticking coefficient, and deposit a thin polymer layer. Table 3 is XPS results show Iodine, carbon, fluorine and oxygen atomic concentration on amorphous carbon surface. Atomic concentration of iodine is 1.8%.

The atomic concentration of the elements detected with XPS at the surface of a-C. The XPS data is collected via Monochromatic Al Kα (1486.6 eV), 10 mA of emission current, band pass every of 160, step size of 0.5 eV. This XPS method is employed to collect atomic concentration results for subsequent data.

TABLE 3

| | I3d | C1s | F1s | O1s |
|---|---|---|---|---|
| Atomic concentration (%) | 1.8 | 69.0 | 20.2 | 9.0 |

Example 1

PECVD Using $CH_3I$

During plasma process, iodine-containing gas may be generated into the following forms: 1) iodine ion ($I^+$, $I^-$); 2) iodine radical (I·); 3) iodine-containing polymeric ion ($^+C_xH_yI_zF_d$, $^-C_xH_yI_zF_d$, and 4) iodine-containing polymeric radicals (·$C_xH_yI_zF_d$). The first form of iodine may be deposited to carbon surface through control of bias power. In addition, the later form will deposit as polymer layer. In this exemplary experiment, iodine-containing gas $CH_3I$ used as a film forming precursor to deposit an iodine-containing polymer layer on a planar wafer (350 nm PE-CVD a-C on Si substrate (purchased from Advantive Tech), or 300 nm spin-on carbon (SOC) on Si substrate (purchased from SKW)). Table 4 shows the process conditions of varying bottom electrode powers of LAM tool for deposition of $CH_3I$ through PE-CVD.

TABLE 4

| Source power | Varied |
|---|---|
| Bias power | Varied |
| Source temperature | 30° C. |
| Bias/chuck electrode temperature | 20° C. |
| Gap | 1.35 cm |
| Pressure | 200 mTorr |
| Ar/$CH_3I$ flow rates | 150/30 sccm |
| $O_2$ | 0 sccm |
| Reaction time | 15 s |

Figure 1B:
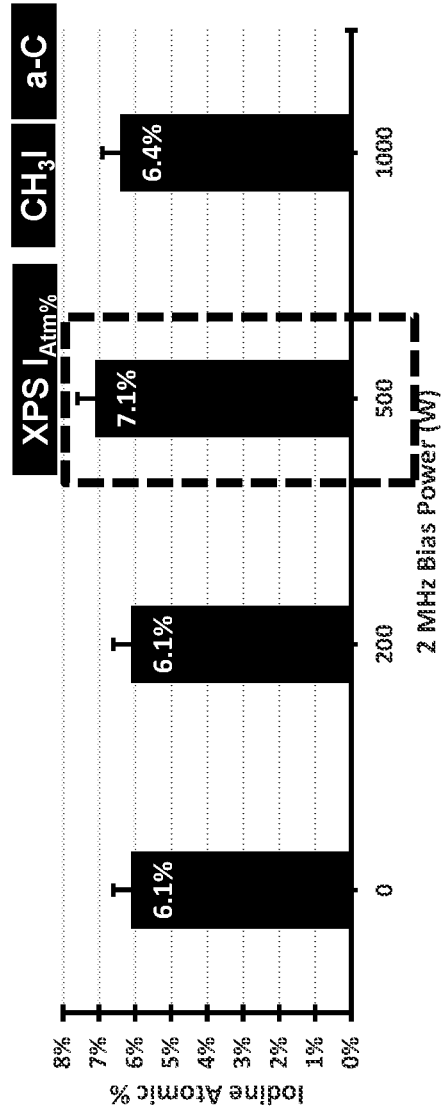
FIG. 1b shows atomic XPS concentration of iodine in a-C materials versus 2 MHz plasma bias power (W) for deposition of $CH_3I$.

FIG. 1a and FIG. 1B show atomic XPS concentrations of iodine on a-C materials at various source powers and various bias powers, respectively, with deposition of $CH_3I$. The atomic XPS concentration is collected via Monochromatic Al Kα (1486.6 eV), 10 mA of emission current, band pass every of 160, step size of 0.5 eV. XPS results show iodine atomic concentration on a-C surface at various bias powers while preserving top power at 500 W and source power while preserving bias power at 500 W. For the condition screened, bias and source power seem have minor effect on iodine concentration, except for 500 w/500 w of source/bias where about 15% increase is showed.

Figure 2:
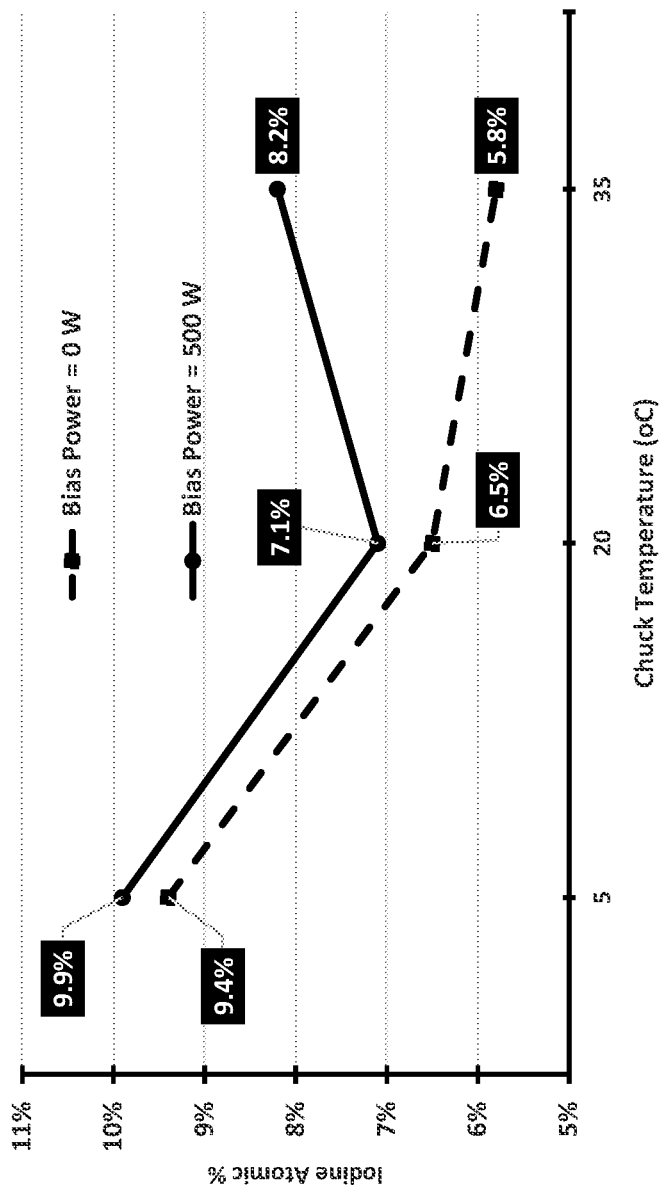
FIG. 2 shows iodine concentrations on the surface of carbon-containing material due to volatility of iodine and iodine-containing species with deposition of $CH_3I$.

Substrate temperature may be controlled through chuck/bottom temperature. Such process conditions shown in Table 5, process conditions of varying bottom electrode temperature, may adjust the iodine concentration on the surface of carbon-containing material due to volatility of iodine and iodine-containing species as shown in FIG. 2. As shown, iodine atomic concentration reduces while chuck temperature increases. Temperature effect shows clear trend at least for bias 0 W. As temperature increases, iodine atomic % decreases. The best result of ~10% was obtained at 5° C. AFM results shows uniform layer (Rq=0.2-0.3 nm). The modification process exhibits smooth layers post process (Rq=0.2-0.3 nm).

TABLE 5

| Source power | 500 W |
|---|---|
| Bias power | Varied |
| Source temperature | 30° C. |
| Bias/chuck electrode temperature | Varied |
| Gap | 1.35 cm |
| Pressure | 200 mTorr |
| Ar/$CH_3I$ flow rates | 150/70 sccm |
| Reaction time | 15 |

Figure 3:
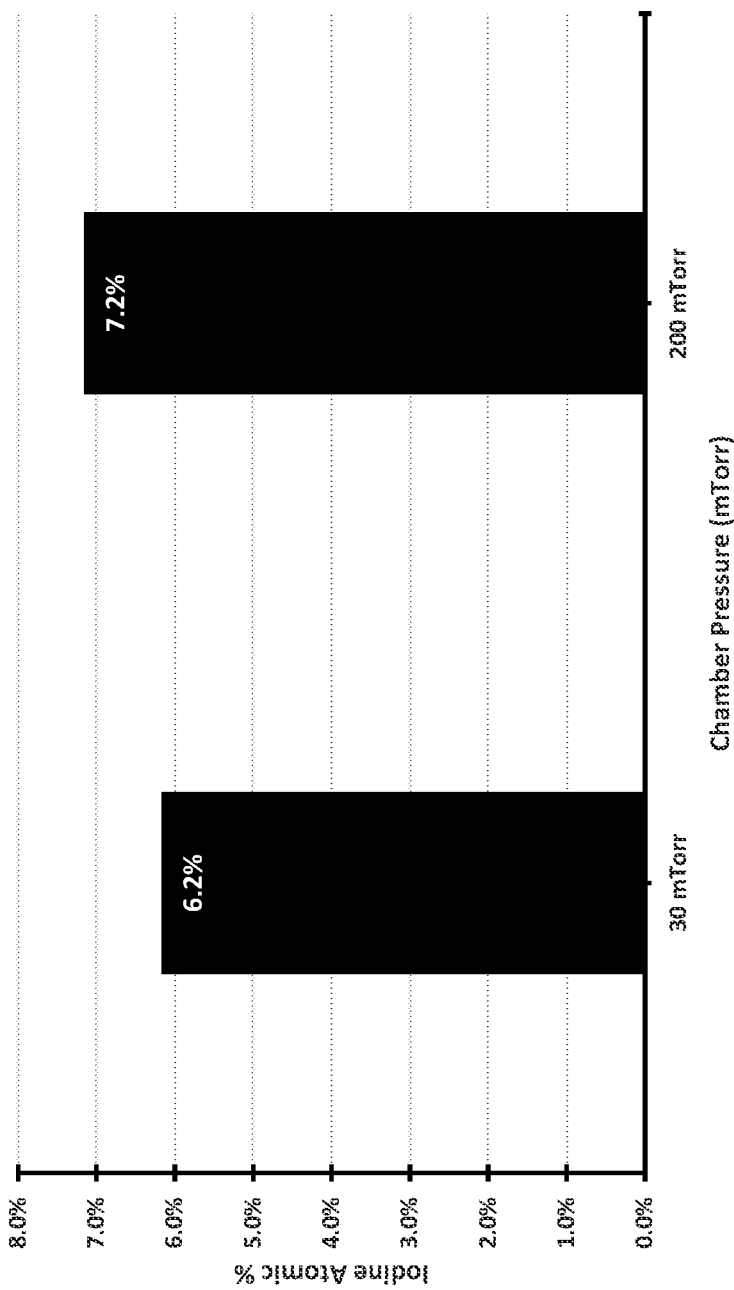
FIG. 3 shows Iodine atomic concentration increase 14% when pressure increases from 30 mTorr to 200 mTorr for deposition of $CH_3I$.
Figure 4:
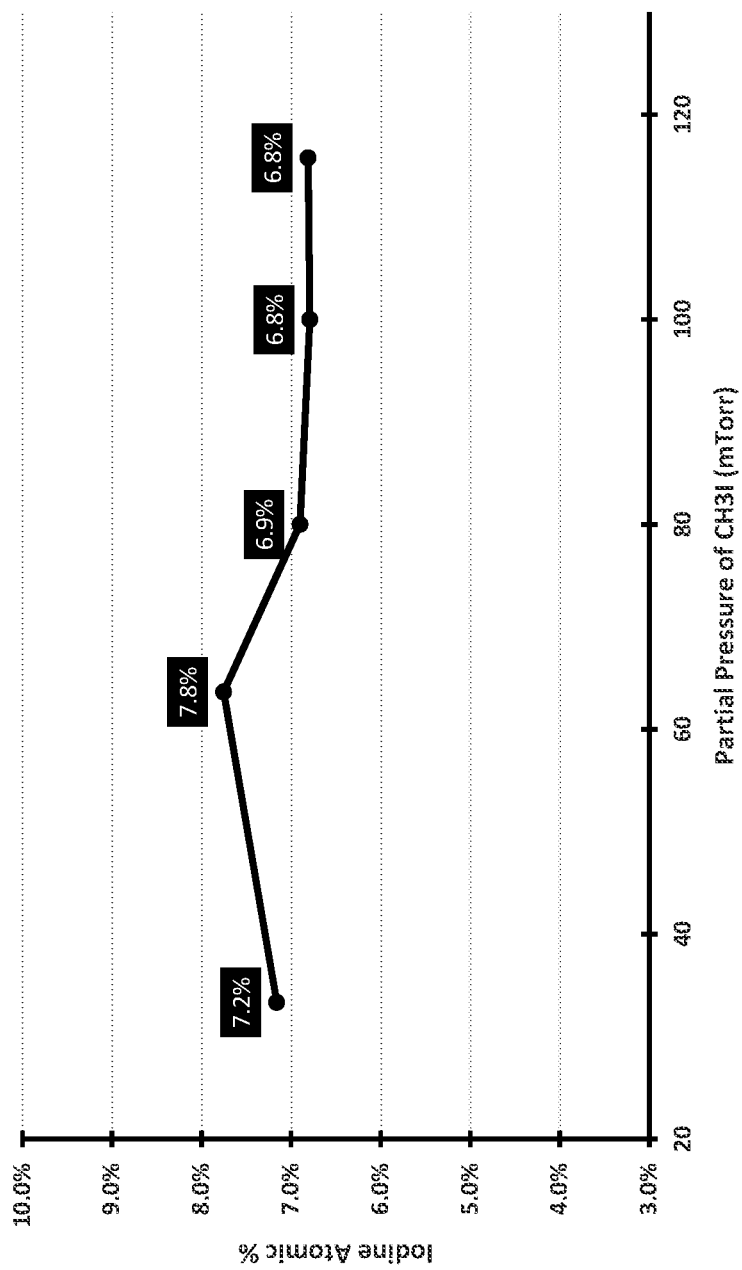
FIG. 4 shows Iodine atomic concentration is optimized at 70/150 sccm conditions for deposition of $CH_3I$.

Process pressure and flow ratio of $CH_3I$ and Ar may be tuned to improve iodine concentration. Such process conditions, that is, process pressure tuning, are shown in Table 6, and flow ratio tuning shown in Table 7 may adjust the iodine concentration on the surface of carbon-containing material. FIG. 3 shows the results of Iodine atomic concentration increase of 14% when pressure increases from 30 mTorr to 200 mTorr. FIG. 4 shows the results of Iodine atomic concentration is optimized at 150/70 sccm conditions.

TABLE 6

| Source power | 500 W |
|---|---|
| Bias power | 500 W |
| Source temperature | 30° C. |
| Bias/chuck electrode temperature | 20° C. |
| Gap | 1.35 cm |
| Pressure | Varied |
| Ar/$CH_3I$ flow rates | 150/70 sccm |
| Reaction time | 15 s |

TABLE 7

| Source power | 500 W |
|---|---|
| Bias power | 500 W |
| Source temperature | 30° C. |
| Bias/chuck electrode temperature | 20° C. |
| Gap | 1.35 cm |
| Pressure | 200 mTorr |
| Ar/$CH_3I$ flow rates | Varied |
| Reaction time | 15 s |

Example 2

Stability Test of Deposited Iodine-Containing Carbon Film Using $CH_3I$

Figure 5:
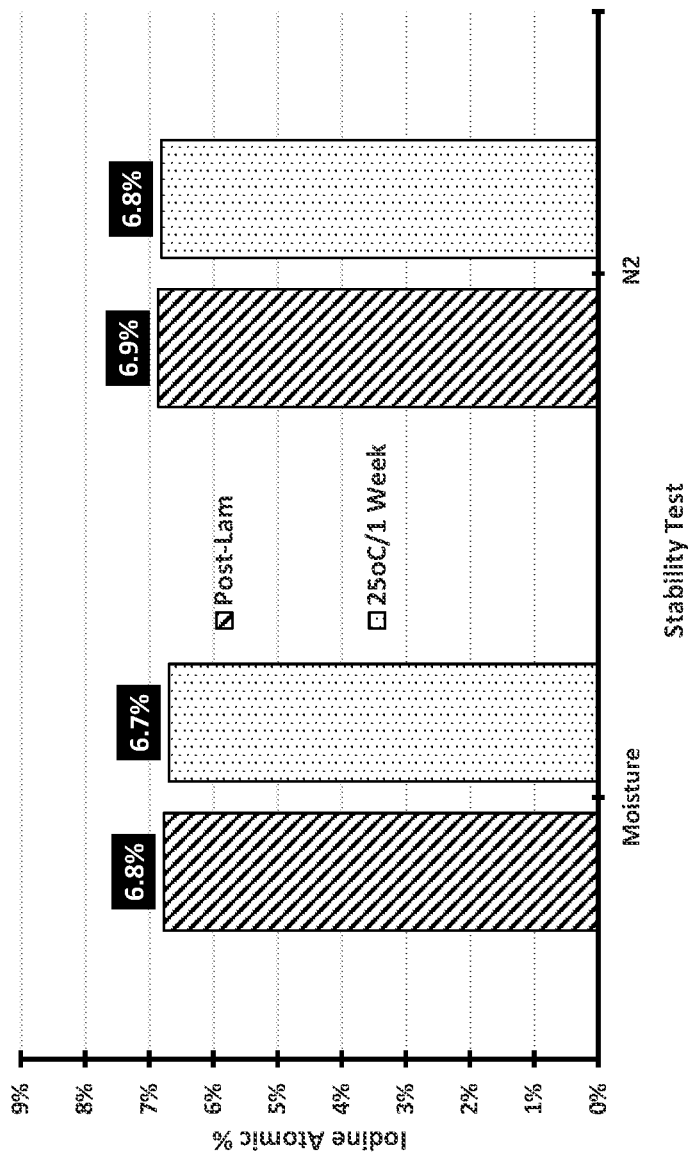
FIG. 5 shows Iodine atomic concentration is maintained approximately constant after 1 week exposure during moisture and light test for deposition of $CH_3I$.

It is known that iodine-containing molecules are unstable under light, and moisture. Hence, it is critical to test the formed films under these conditions. The tested iodine-containing carbon film was prepared under following condition: source power 500 W/bias power 500 W, source temperature 30° C., bias/chuck electrode temperature 20° C., gap 1.35 cm, pressure varied, Ar/$CH_3I$, 150/70 sccm, reaction time 15 s. These synthesized film was carried out two stability test: 1) Moisture test (samples were sitting in ambient condition [room-air], at room temperature, in a dark box, in 1 week exposure), and light test (samples were sitting in $N_2$ condition, at room temperature, in 1 week exposure to room light). The results of iodine concentration stability may be found in FIG. 5, which shows Iodine atomic concentration is maintained approximately constant (approximately 7%) after 1 week exposure during moisture and light test for $CH_3I$. This finding shows the stability of synthesized film.

Figure 6A:
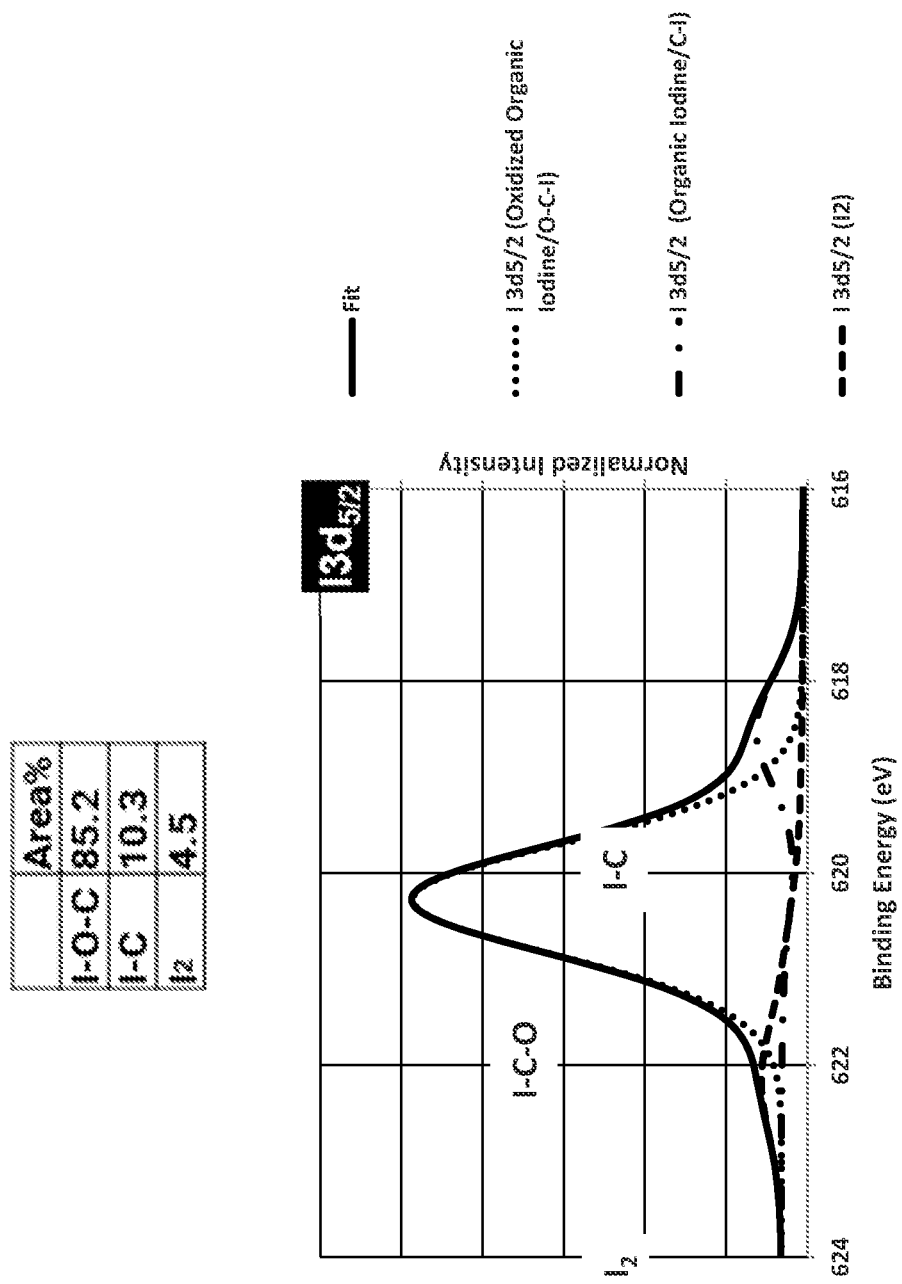
FIG. 6a shows Iodine I3d5/2 with deposition of $CH_3I$.
Figure 6B:
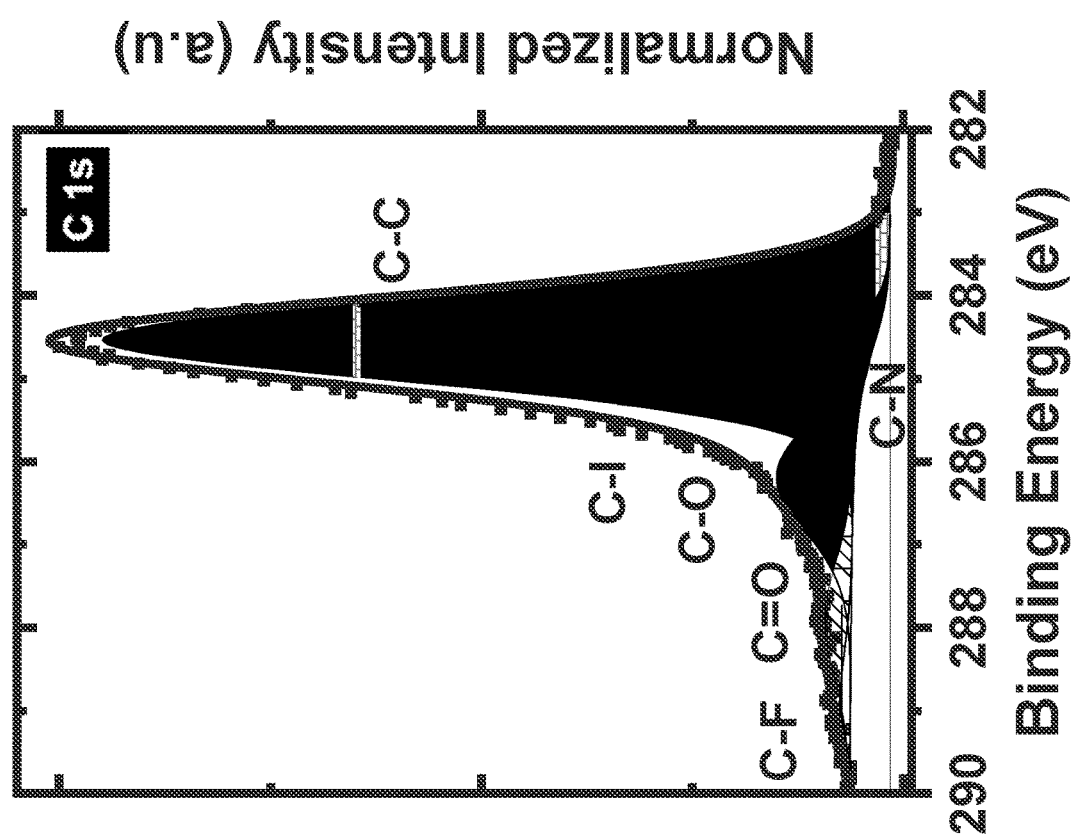
FIG. 6b shows carbon C1s spectra with deposition of $CH_3I$.

XPS Data analysis: the deposited iodine-containing carbon film is further analyzed by XPS (Monochromatic Al Kα (1486.6 eV), 10 mA of emission current, band pass every of 20, step size of 0.1 eV). The analyzed iodine-containing carbon film was prepared under following condition; source power 500 W/bias power 500 W, source temperature 30° C., bias/chuck electrode temperature 20° C., gap 1.35 cm, pressure Varied, Ar/$CH_3I$, 150/70 sccm, reaction time 15 s. As shown in FIG. 6a, Iodine I3d5/2 has 3 types of bonding on a-C surface: organic Iodine (I—C, I—C—O) and very little amount of absorbed $I_2$ molecules. In carbon C1s spectra shown in FIG. 6b, C—I (285.1 eV) bonding also found in C1s peak convolution, which confirm iodine bonds to carbon matrix. This bonding further confirms the film stability, that is, the film is uniform and has a stable iodine atomic concentration.

Example 3

Figure 7A:
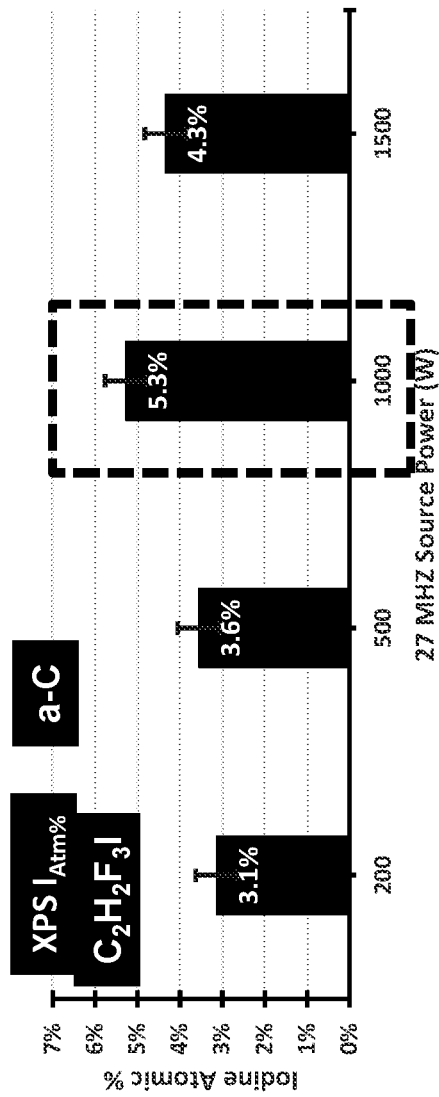
FIG. 7a shows optimal iodine atomic concentration may be achieved through tuning source power at 1000 W using $C_2H_2F_3I$.
Figure 7B:
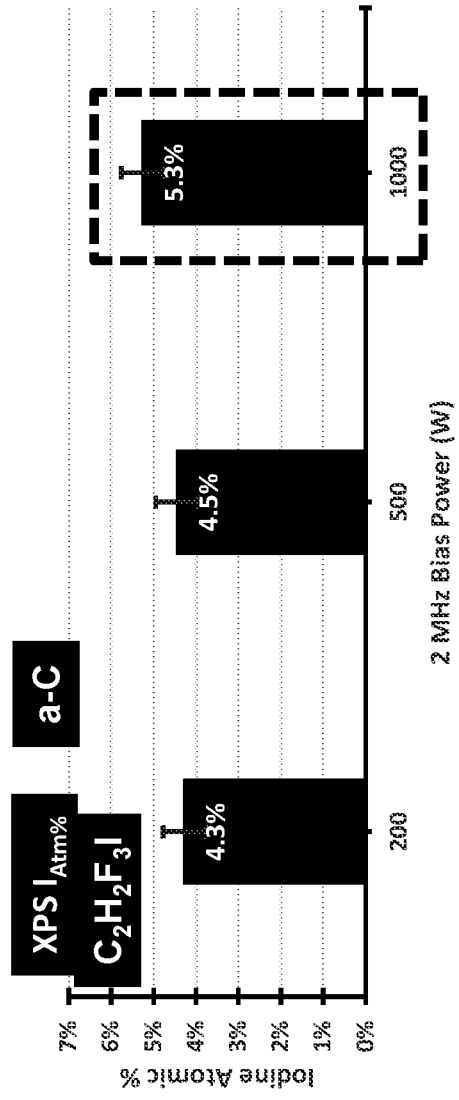
FIG. 7b shows optimal iodine atomic concentration may be achieved through tuning bias power at 1000 W using $C_2H_2F_3I$.

Plasma Deposition Using $C_2H_2F_3I$ via Lam Tool Etcher $C_2H_2F_3I$ was used as a film-forming precursor to deposit an iodine-containing polymer film on a-C layer. As discuss in the previous examples, iodine ions, iodine radicals and iodine-containing species may be controlled through source power and bias power. This process control (shown in Table 8) results in optimal condition for iodine concentration on carbon-containing material as shown in FIG. 7a and FIG. 7b, which show optimal iodine atomic concentrations may be achieved through tuning source and bias powers at 1000 W (27 MHz source power)/1000 W (2 MHz bias power) using $C_2H_2F_3I$, respectively.

TABLE 8

| Source power | Varied |
| --- | --- |
| Bias power | Varied |
| Source temperature | 30° C. |
| Bias/chuck electrode temperature | 20° C. |
| Gap | 1.35 cm |
| Pressure | 200 mTorr |
| Ar/$C_2H_2F_3I$ flow rates | 150/30 sccm |
| Reaction time | 15 s |

Example 4

Plasma Deposition Using $CH_3I$ and $C_3HF_4N$ via LAM Tool Etcher $CH_3I$ and $C_3HF_4N$ were used as a film-forming precursor and an N-containing co-reactant to deposit an iodine-containing polymer film on a-C layer. For comparison, $CH_3I$ and $N_2$ were used as a film-forming precursor and an N-containing co-reactant to deposit an iodine-containing polymer film on a-C layer. As discuss in the previous examples, during plasma process, iodine-containing gas may be generated into three forms: 1) iodine ion ($I^+$, $I^-$); 2) iodine radical (I·); 3) iodine containing polymeric ion ($^+C_xH_yI_zF_d$, $^-C_xH_yI_zFd$, and 4) iodine containing polymeric radicals (·$C_xH_yI_zF_d$). The first and third form of iodine may be deposited to carbon surface through control of the bias power. In addition, these chemical forms will deposit as a polymer layer that could enhance EUV absorption of layer during patterning process. These iodine forms may be further captured by nitrogen species from $C_3HF_4N$ at the gas phase as well as the surface of deposited polymer forming a deposited iodine and nitrogen containing carbon film. Such process condition of LAM tool etcher is shown in Table 9.

TABLE 9

| Source power | 500 W |
| --- | --- |
| Bias power | 500 W |
| Source temperature | 30° C. |
| Bias/chuck electrode temperature | 20° C. |
| Gap | 1.35 cm |
| Pressure | 200 mTorr |
| Ar/$CH_3I$ flow rates | 150/70 sccm |
| $C_3HF_4N$ or $N_2$ flow rates | 15 sccm |
| Reaction time | 16 |

Figure 9:
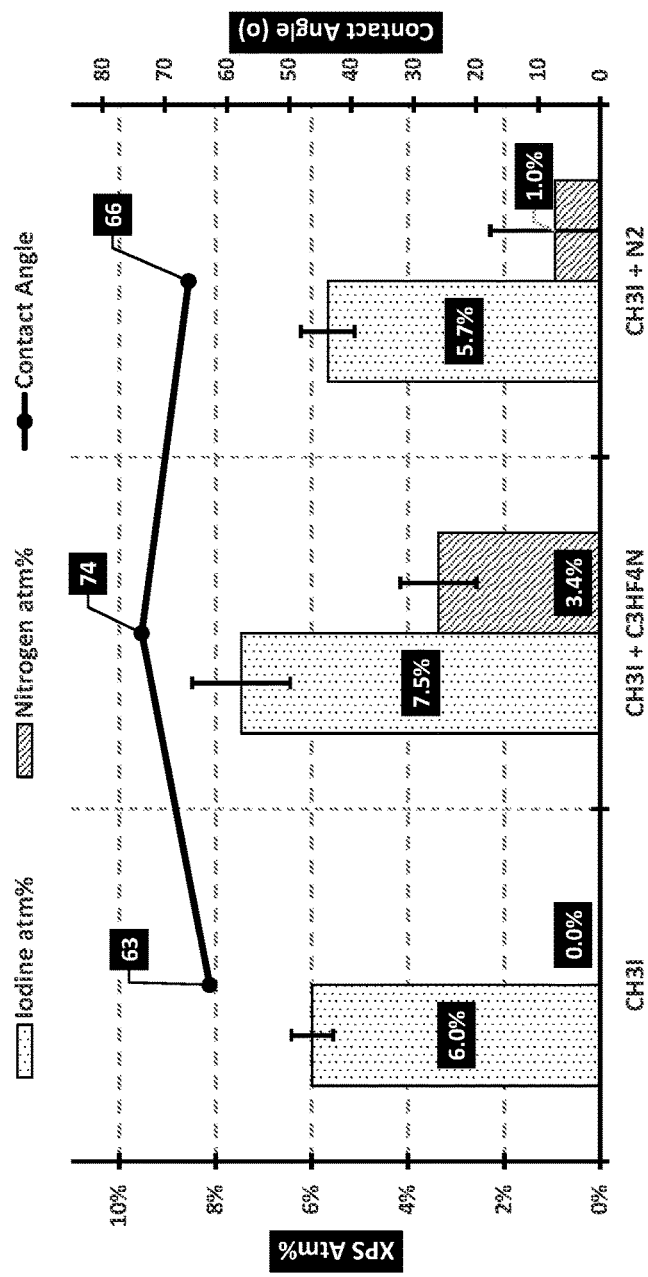
FIG. 9 shows XPS results that demonstrate Iodine atomic concentration on a-C surface.

The deposited iodine and nitrogen containing carbon film is further analyzed by Kratos Axis Supra X-ray photoelectron spectroscopy (XPS). FIG. 9 shows atomic XPS concentrations of iodine on a-C surface at various bias power. The mixture of $CH_3I$ and $C_3HF_4N$ shows an improvement of iodine atomic % (~25% increase) as compared to $CH_3I$ alone and $CH_3I+N_2$. In order to calculate the atomic concentrations of elements inside the deposited film, the following XPS method was employed: Monochromatic Al Kα (1486.6 eV), 10 mA of emission current, band pass every of 160, step size of 0.5 eV. In addition, XPS high resolution spectra was also used to determine the presence of different bondings, such spectra were collected via following method: Monochromatic Al Kα (1486.6 eV), 10 mA of emission current, band pass every of 20, step size of 0.1 eV.

Figure 10:
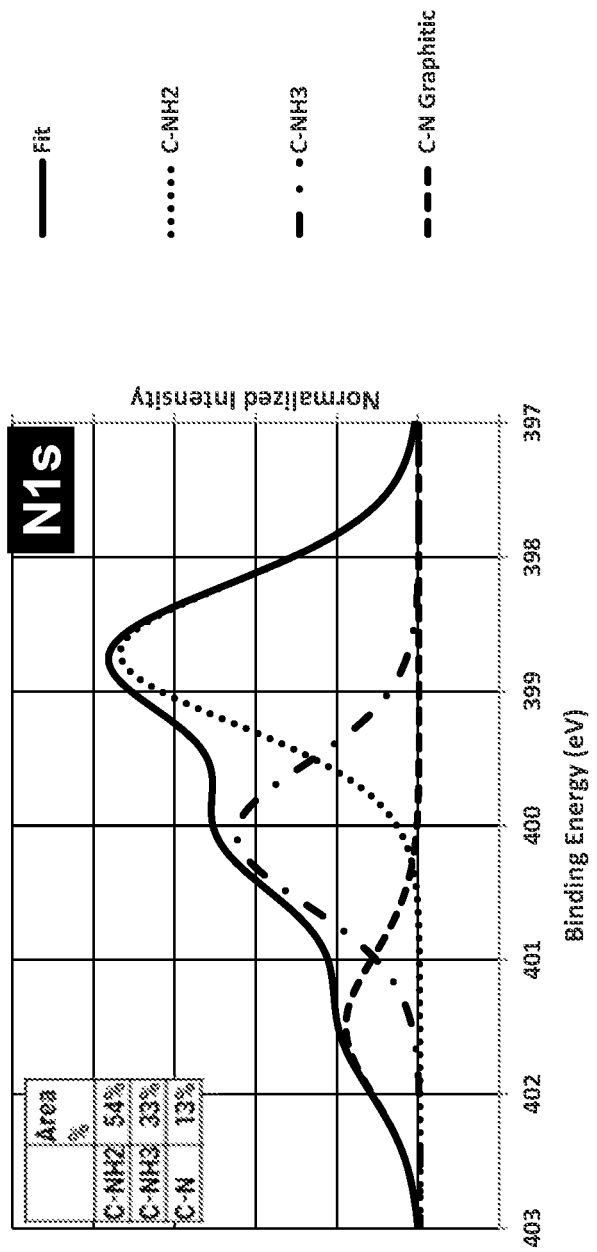
FIG. 10 shows Iodine I3d5/2 has 3 types of bonding on a-C surface.

The analyzed iodine containing carbon film was prepared under following condition: source power 500 W/bias power 500 W, source temperature 30° C., bias/chuck electrode temperature 20° C., gap 1.35 cm, pressure 200 mTorr, Ar/$CH_3I$/$C_3HF_4N$, 150/70/15 sccm, or reaction time 15 s. As shown in FIG. 10, N1s peak of Ar/$CH_3I$/$C_3HF_4N$ has 3 types of bondings on the a-C surface: C—$NH_2$, C—$NH_3$, and C—N. These bondings suggest the capture of iodine species based upon the increase in iodine concentration. In nitrogen mixing case (Ar/$CH_3I$/$N_2$, 150/70/15 sccm), nitrogen is not well incorporated into the carbon film (FIG. 9), hence there is no increased in iodine concentration.

In summary, the disclosed methods are providing not only a new/novel chemistry to deposit an iodine film on carbon surface, but also a method to enhance iodine concentration doped in the carbon surface. Such iodine-modified layer may be utilized in various applications in semiconductor fabricating device.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for depositing an iodine-containing film on a substrate material, the method comprising:
   a) exposing the substrate material to a vapor of a film-forming composition comprising an iodine-containing precursor selected from $C_6H_5I$, $C_6H_4I_2$, $IF_3$, $IF_5$, and $IF_7$;
   b) exposing the substrate material to a vapor of a co-reactant $C_3HF_4N$ sequentially or simultaneously with the step a); and
   c) depositing the iodine-containing film formed by the iodine-containing precursor on the substrate material through a vapor deposition method.

2. The method of claim 1, wherein the step b) comprises the step of modifying the substrate material or doping iodine from the iodine-containing precursor into the substrate material.

3. The method of claim 2, wherein an iodine atomic concentration in the substrate material ranges from approximately 0.01% to approximately 50%.

4. The method of claim 1, wherein the vapor deposition method is a thermal or plasma deposition process.

5. The method of claim 1, wherein an iodine atomic concentration in the iodine-containing film ranges from approximately 0.01% to approximately 50% with a uniform concentration through the iodine-containing film.

6. The method of claim 1, wherein a deposition temperature ranges from −110° C. to 1100° C.

7. A method for depositing an iodine-containing and nitrogen-containing film on a substrate material, the method comprising:
   a) sequentially or simultaneously exposing the substrate material to a vapor of a film-forming composition and a vapor of a nitrogen-containing molecule,
   wherein the film-forming composition comprises an iodine-containing precursor selected from $C_6H_5I$, $C_6H_4I_2$, $IF_3$, $IF_5$, and $IF_7$,
   wherein the nitrogen-containing molecule has a general formula $C_mH_nF_oNH_b$ or $C_mH_nF_oN-R^1$ where m=1-6, n=0-13, o=0-13, b=0-2, and $R^1$ is a $C_1$-$C_5$ hydrocarbon; and
   b) depositing the iodine-containing film formed by the iodine-containing precursor on the substrate material through a thermal or plasma method,
   wherein the step b) comprises modifying the substrate material or doping iodine into the substrate material.

8. The method of claim 7, wherein the nitrogen-containing molecule is $C_3HF_4N$.

\* \* \* \* \*